(12) United States Patent
Zhou

(10) Patent No.: US 9,911,833 B2
(45) Date of Patent: Mar. 6, 2018

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/335,248

(22) Filed: Oct. 26, 2016

(65) Prior Publication Data

US 2017/0133489 A1 May 11, 2017

(30) Foreign Application Priority Data

Nov. 5, 2015 (CN) .......................... 2015 1 0746439

(51) Int. Cl.
*H01L 29/66* (2006.01)
*H01L 29/78* (2006.01)
(Continued)

(52) U.S. Cl.
CPC .... *H01L 29/66795* (2013.01); *H01L 21/0262* (2013.01); *H01L 21/3065* (2013.01);
(Continued)

(58) Field of Classification Search
CPC ............. H01L 29/66795; H01L 29/785; H01L 21/0262; H01L 21/3065; H01L 29/6656; H01L 29/66545
See application file for complete search history.

(56) References Cited

U.S. PATENT DOCUMENTS

2014/0319623 A1 10/2014 Tsai
2014/0339645 A1 11/2014 Lian
(Continued)

FOREIGN PATENT DOCUMENTS

JP 2008016522 A 1/2008

*Primary Examiner* — Roy Potter
*Assistant Examiner* — Paul Patton
(74) *Attorney, Agent, or Firm* — Anova Law Group, PLLC

(57) ABSTRACT

A method for fabricating a semiconductor structure includes forming a plurality of first fin structures in a peripheral region of a substrate and a plurality of second fin structures in a core region of the substrate, forming a first dummy gate structure including a first dummy oxide layer and a first dummy gate electrode layer on each first fin structure and a second dummy gate structure including a second dummy oxide layer and a second dummy gate electrode layer on each second fin structure. The method further includes removing each first dummy gate structure together with each second dummy gate electrode layer, forming a first gate oxide layer on the exposed portion of each first fin structure, and then removing each second dummy gate oxide layer. The method further includes forming a first gate structure on each first fin structure and a second gate structure on each second fin structure.

20 Claims, 10 Drawing Sheets

(51) Int. Cl.
*H01L 21/3065* (2006.01)
*H01L 21/02* (2006.01)

(52) U.S. Cl.
CPC .... *H01L 29/6656* (2013.01); *H01L 29/66545* (2013.01); *H01L 29/785* (2013.01)

(56) References Cited

U.S. PATENT DOCUMENTS

| | | | | |
|---|---|---|---|---|
| 2014/0374840 | A1* | 12/2014 | Lee | H01L 27/0886 257/401 |
| 2015/0021681 | A1* | 1/2015 | Hou | H01L 21/823807 257/330 |
| 2015/0348788 | A1* | 12/2015 | Liu | H01L 29/66545 257/392 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201510746439.3, filed on Nov. 5, 2015, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

In the field of semiconductor fabrication, with very-large-scale integration (VLSI) becoming the development trend, the feature size of integrated circuits steadily decreases. To accommodate the decrease of the feature size, the channel length in metal-oxide-semiconductor field-effect-transistors (MOSFET) also continuously decreases. However, as the channel length of devices becomes shorter, the distance between the source region and the drain region in the devices may also be reduced. Therefore, the gate electrode in traditional planar MOSFETs may not have sufficient ability to control the channel. It becomes more difficult for the gate voltage to pinch off the channel, and thus the subthreshold leakage phenomena, i.e. the short-channel effects may easily take place.

In order to better adapt to the decrease of the feature size, semiconductor fabrication technology gradually changes from planar MOSFETs to more efficient three-dimensional (3D) transistors, such as fin field-effect-transistors (Fin-FETs). In a Fin-FET, gate electrode is able to control an ultra-thin structure (e.g., a fin structure) from the two side surfaces of the ultra-thin structure. Therefore, Fin-FETs demonstrate much better gate-to-channel controllability than planar MOSFETs. As such, Fin-FETs may be able to significantly suppress the short-channel effects. In addition, compared to other devices, Fin-FETs may also demonstrate better compatibility with the existing fabrication technology for integrated circuits.

Fin-FETs may be classified mainly into two categories based on their functions, namely, core devices and peripheral devices (e.g. input/output (I/O) devices). In addition, according to the electrical types of the devices, the core devices may be further categorized into two types: core N-type metal-oxide-semiconductor (NMOS) devices and core P-type metal-oxide-semiconductor (PMOS) devices; and the peripheral devices may be further categorized into two types: peripheral NMOS devices and peripheral PMOS devices.

Generally, the operation power voltage of the peripheral devices is significantly larger than the operation power voltage of the core devices. Therefore, the thickness of the gate dielectric layers in peripheral devices is usually larger than the thickness of the gate dielectric layers in core devices. In order to prevent electrical breakdown and other issues, for a device with a high operation power voltage, the thickness of the gate dielectric layer in the device may need to be increased. The thickness of the dielectric layers in peripheral devices may also need to be increased.

However, the electrical performance of existing semiconductor structures may still need to be improved. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method includes forming a plurality of fin structures on a substrate including a peripheral region and a core region. Fin structures formed in the peripheral region are first fin structures and fin structures formed in the core region are second fin structures. The method for fabricating the semiconductor structure also includes forming a first dummy gate structure, including a first dummy gate electrode layer and a first dummy oxide layer, on each first fin structure, and a second dummy gate structure, including a second dummy gate electrode layer and a second dummy oxide layer, on each second fin structure. The method further includes forming a dielectric layer on the substrate having a top surface of the leveled with the top surfaces of the first dummy gate structures and the second dummy gate structures. The method then includes forming a first opening to expose the first dummy oxide layer by removing the first dummy gate electrode layer and a second opening to expose the second dummy oxide layer by removing the second dummy gate electrode layer, and removing the first dummy gate oxide layer in the first opening to expose a portion of the first fin structure. Further, the method includes forming a first gate oxide layer on the exposed portion of each first fin structure, removing each second dummy gate oxide layer in the second opening to expose a portion of the second fin structure, and forming a gate dielectric layer to cover each first gate oxide layer, sidewall surfaces of each first opening, and bottom and sidewall surfaces of each second opening. The method for fabricating the semiconductor structure further includes forming a metal layer to cover the gate dielectric layer and fill up the first openings and the second openings. The first gate oxide layer, the gate dielectric layer, and the metal layer formed in each first opening together form a first gate structure, and the gate dielectric layer and the metal layer formed in each second opening together form a second gate structure.

Another aspect of the present disclosure provides a semiconductor structure. The semiconductor structure includes a semiconductor base structure. The semiconductor base structure includes a plurality of fin structures formed on a substrate including a peripheral region and a core region. Fin structures formed in the peripheral region are first fin structures and fin structures formed in the core region are second fin structures. The semiconductor structure further includes a first gate structure formed on a portion of each first fin structure in the peripheral region, a second gate structure formed on a portion of each second fin structure in the core region, and a dielectric layer formed on the substrate having a top surface leveled with top surfaces of the first gate structures and the second gate structures. The first gate structure in the peripheral region includes a first gate oxide layer formed on the first fin structure, a gate dielectric layer formed on the first gate oxide layer and sidewall surfaces of the corresponding first opening, and a first gate electrode layer formed on the first gate dielectric layer, while the second gate structure in the core region includes a second gate dielectric layer formed on the second fin structure and sidewall surfaces of the corresponding second opening, and a second gate electrode layer formed on the second gate dielectric layer. The first gate oxide layer is formed in a first opening formed by removing a first dummy gate structure, including a first dummy gate electrode layer and a first dummy gate oxide layer, previously formed on the first fin structure. The second gate structure is formed in a second opening formed by removing a second dummy gate structure, including a second dummy gate electrode layer and a second dummy gate oxide layer, previously formed on the second fin structure. Moreover, the second dummy gate oxide layer is removed after forming the first gate oxide layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

For existing semiconductor devices, the electrical performance may still need to be improved. FIGS. 1-5 show schematic cross-section views of semiconductor structures at certain stages of an existing fabrication process.

Figure 1:
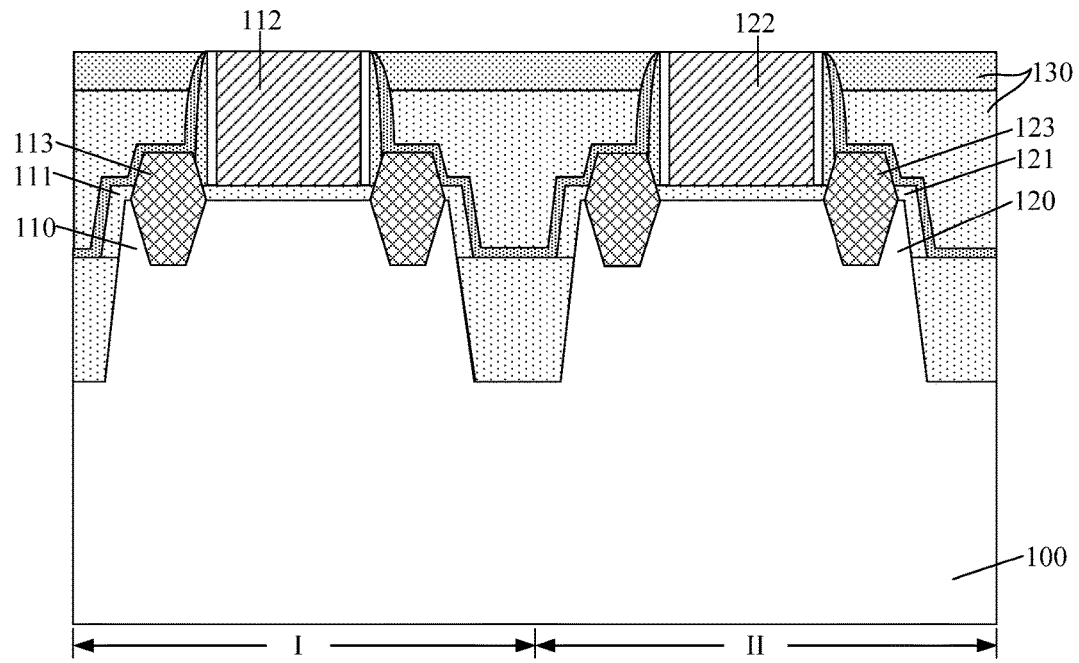
FIGS. 1-5 illustrate schematic cross-section views of semiconductor structures at certain stages of an existing fabrication process.

Referring to FIG. 1, a semiconductor base structure is formed. The semiconductor base structure includes a substrate 100 and a plurality of fin structures protruding from the substrate 100. The substrate 100 includes a peripheral region I and a core region II, and the plurality of fin structures are formed in both the peripheral region I and the core region II. For illustration purposes, the semiconductor base structure is described to have a first fin structure 110 formed on the substrate 100 in the peripheral region I and a second fin structure 120 formed on the substrate 100 in the core region II.

Further, the semiconductor base structure also includes a first dummy gate structure (not shown) formed in the peripheral region I, a second dummy gate structure (not to shown) formed in the core region II, peripheral-region source/drain regions 113 formed on the two sides of the first dummy gate structure, core-region source/drain regions 123 formed on the two sides of the second dummy gate structure. The first dummy gate structure also includes a first dummy gate oxide layer 111 formed on the surface of the first fin structure 110, and a first dummy gate electrode layer 112 formed on the surface of the first dummy gate oxide layer 111. The second dummy gate structure also includes a second dummy gate oxide layer 121 formed on the surface of the second fin structure 120, and a second dummy gate electrode layer 122 formed on the surface of the second dummy gate oxide layer 121. The semiconductor base structure further includes a dielectric layer 130 covering the side surfaces of the first dummy gate structure and the second dummy gate structure.

Figure 2:
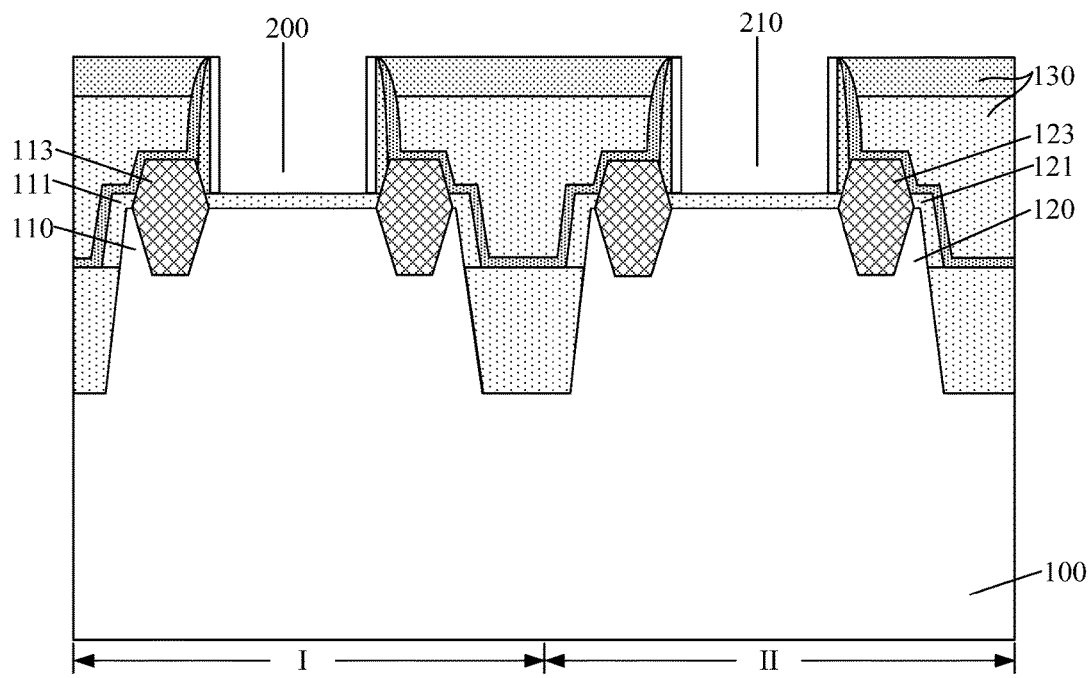

Referring to FIG. 2, the first dummy gate electrode layer 112 (referring to FIG. 1) is removed by etching to expose a portion of the surface of the first dummy gate oxide layer 111 and form a first opening 200 in the dielectric layer 130. Similarly, the second dummy gate electrode layer 122 (referring to FIG. 1) is also removed by etching to expose a portion of the surface of the second dummy gate oxide layer 121 and form a second opening 210 in the dielectric layer 130.

Figure 3:
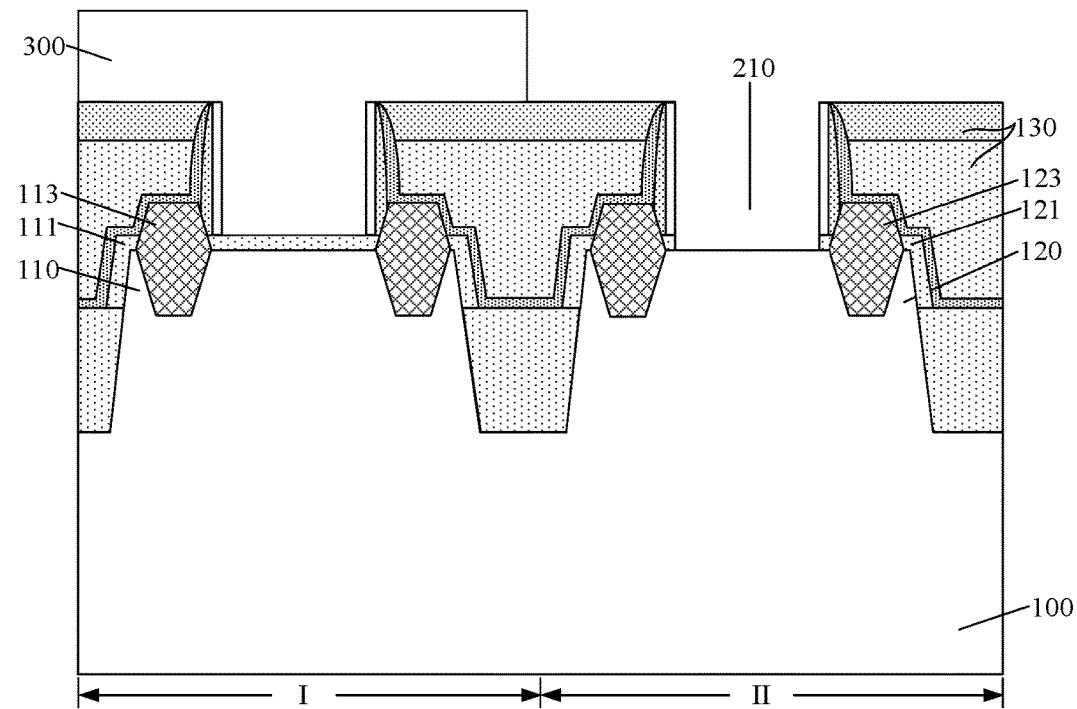

Referring to FIG. 3, a first patterned layer 300 is formed to cover the peripheral region I. Specifically, the first patterned layer 300 covers the dielectric layer 130 in the peripheral region I and also fills up the first opening 200 (referring to FIG. 2). However, the first patterned layer 300 does not cover the second dummy gate oxide layer 121 (referring to FIG. 2) on the bottom of the second opening 210. That is, the second dummy gate oxide layer 121 (referring to FIG. 2) on the bottom of the second opening 210 is exposed. Further, the second dummy gate oxide layer 121 on the bottom of the second opening 210 is removed through an etching process using the first patterned layer 300 as an etch mask. Finally, the first patterned layer 300 is removed after removing the second dummy gate oxide layer 121.

Figure 4:
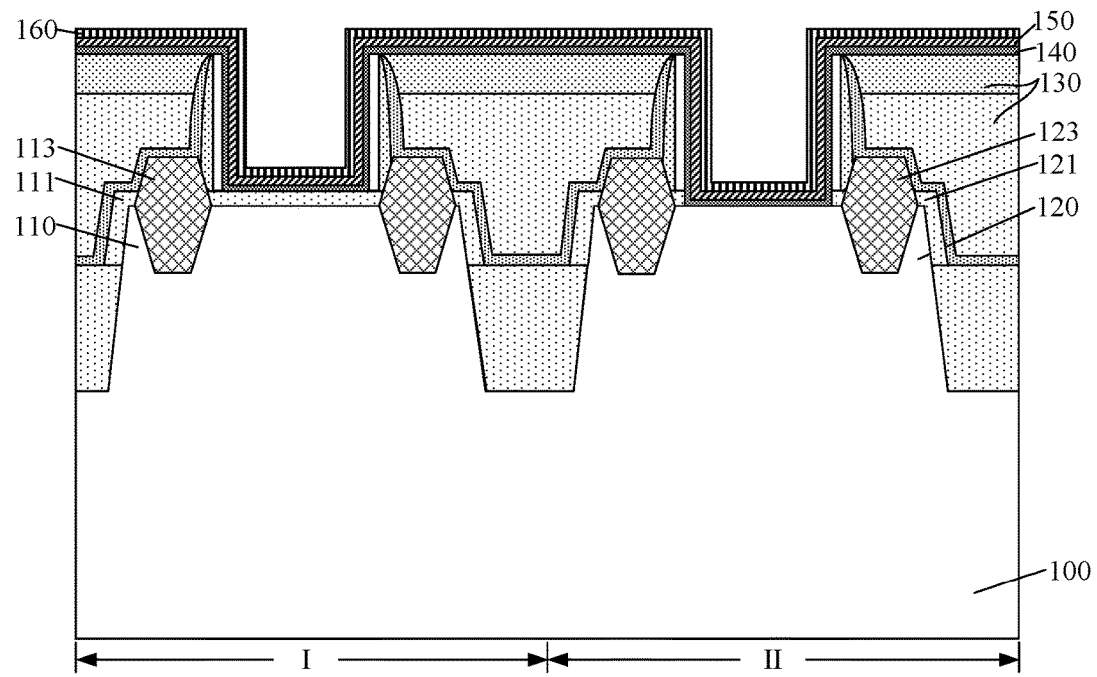

Referring to FIG. 4, an interface layer 140 is formed on the surface of the first dummy gate oxide layer 111 situated on the bottom of the first opening 200 (referring to FIG. 2), the sidewall surfaces of the first opening 200, the bottom surface of the second opening 210 (referring to FIG. 2), and the sidewall surfaces of the second opening 210. The interface layer 140 also covers the surface of the dielectric layer 130. Further, a gate dielectric layer 150 is formed on the surface of the interface layer 140, and then a work function layer 160 is formed on the surface of the gate dielectric layer 150.

Figure 5:
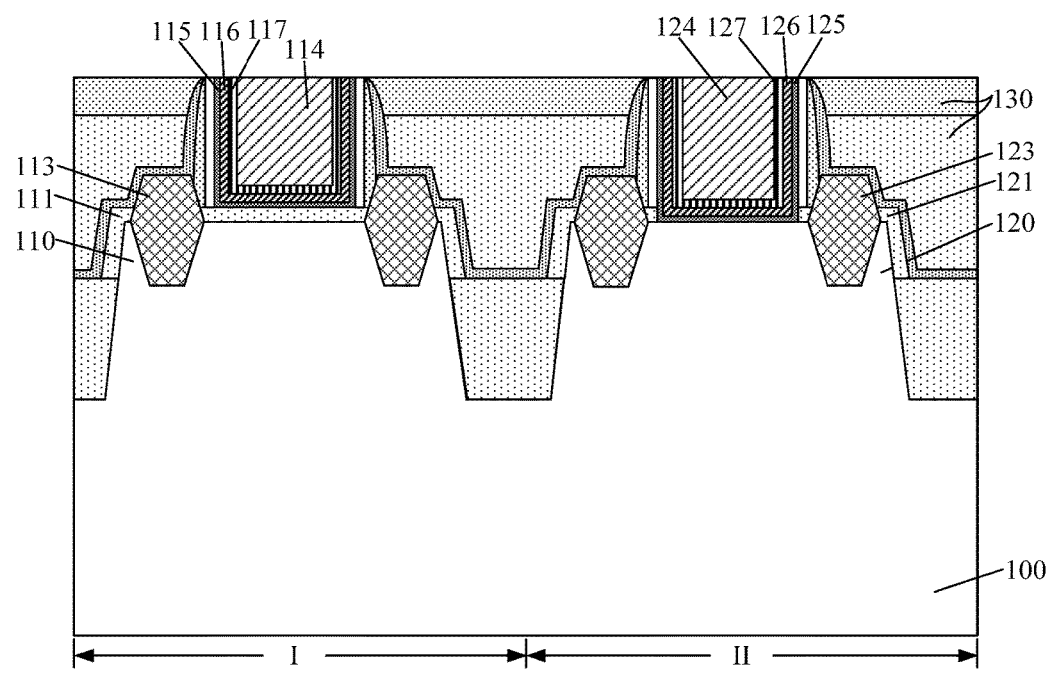

Referring to FIG. 5, a metal layer (not shown) is formed on the work function layer 160. The metal layer fills up the first opening 200 (referring to FIG. 2) and the second opening 210 (referring to FIG. 2). The top surface of the metal layer is higher than the top surface of the dielectric layer 130. The portion of the metal layer formed above the top surface of the dielectric layer 130 is then removed by polishing. Further, a first gate electrode layer 114 is formed on the surface of the work function layer 160 in the peripheral region I and a second gate electrode layer 124 is formed on the surface of the work function layer 160 in the core region II.

Specifically, during the polishing process to remove the portion of the metal layer formed above the top surface of the dielectric layer 130, the portion of each of the work function layer 160, the gate dielectric layer 150, and the interface layer 140 formed above the top surface of the dielectric layer 130 is also removed. As such, in the peripheral region I, a first interface layer 115 is formed on the surface of the first dummy gate oxide layer 111 and the sidewall surfaces of the first opening 200 (referring to FIG. 2), a first gate dielectric layer 116 is formed on the surface of the first interface layer 115, and a first work function layer 117 is formed on the surface of the first gate dielectric layer 116. Simultaneously, in the core region I, a second interface layer 125 is formed on the bottom and the sidewall surfaces of the second opening 210 (referring to FIG. 2), a second gate dielectric layer 126 is formed on the surface of the second interface layer 125, and a second work function layer 127 is formed on the surface of the second gate dielectric layer 126. The first dummy gate oxide layer 111, the first interface layer 115, the first gate dielectric layer 116, the first work function layer 117, and the first gate electrode layer 114 together form a first gate structure in the peripheral region I. In the meantime, the second interface layer 125, the second gate dielectric layer 126, the second work function layer 127, and the second gate electrode layer 124 together form a second gate structure in the core region II.

According to current fabrication methods, the first dummy gate oxide layer 111 is served as a part of the first gate structure. However, the etching process performed in the course of fabricating the first dummy gate structure (not shown) may easily cause damages to the first dummy gate oxide layer 111, and thus may further affect the quality of the subsequently-formed first gate structure in the peripheral region I. Because the damaged region may be closed to the channel edge of the peripheral device, the electrical performance of the semiconductor device may be degraded.

Figure 19:
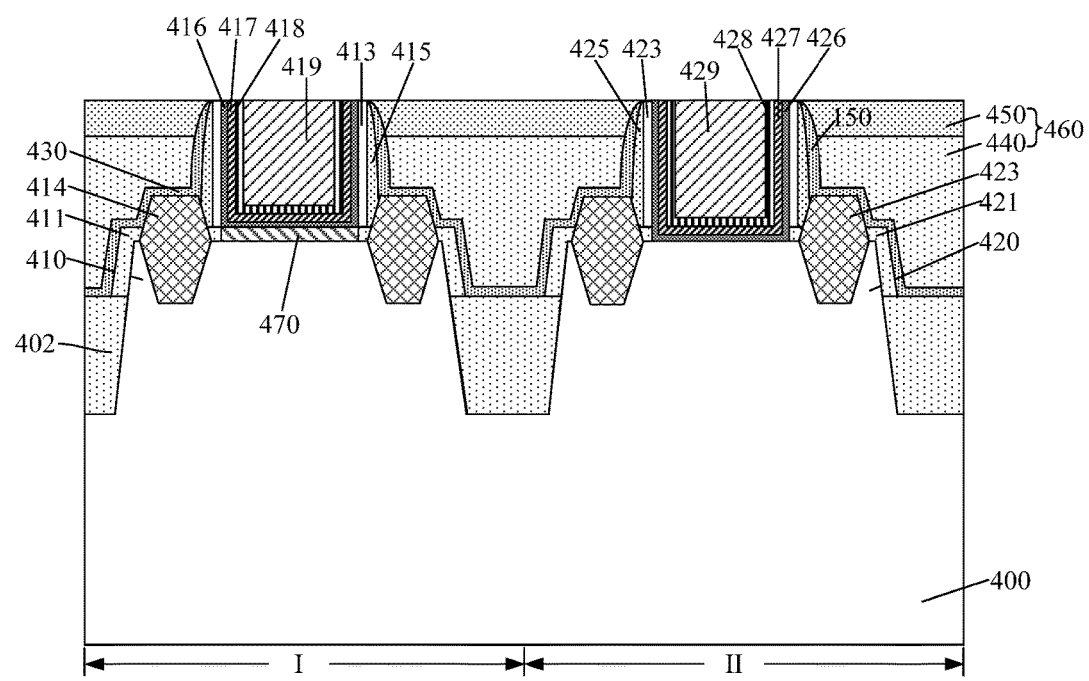
Figure 20:
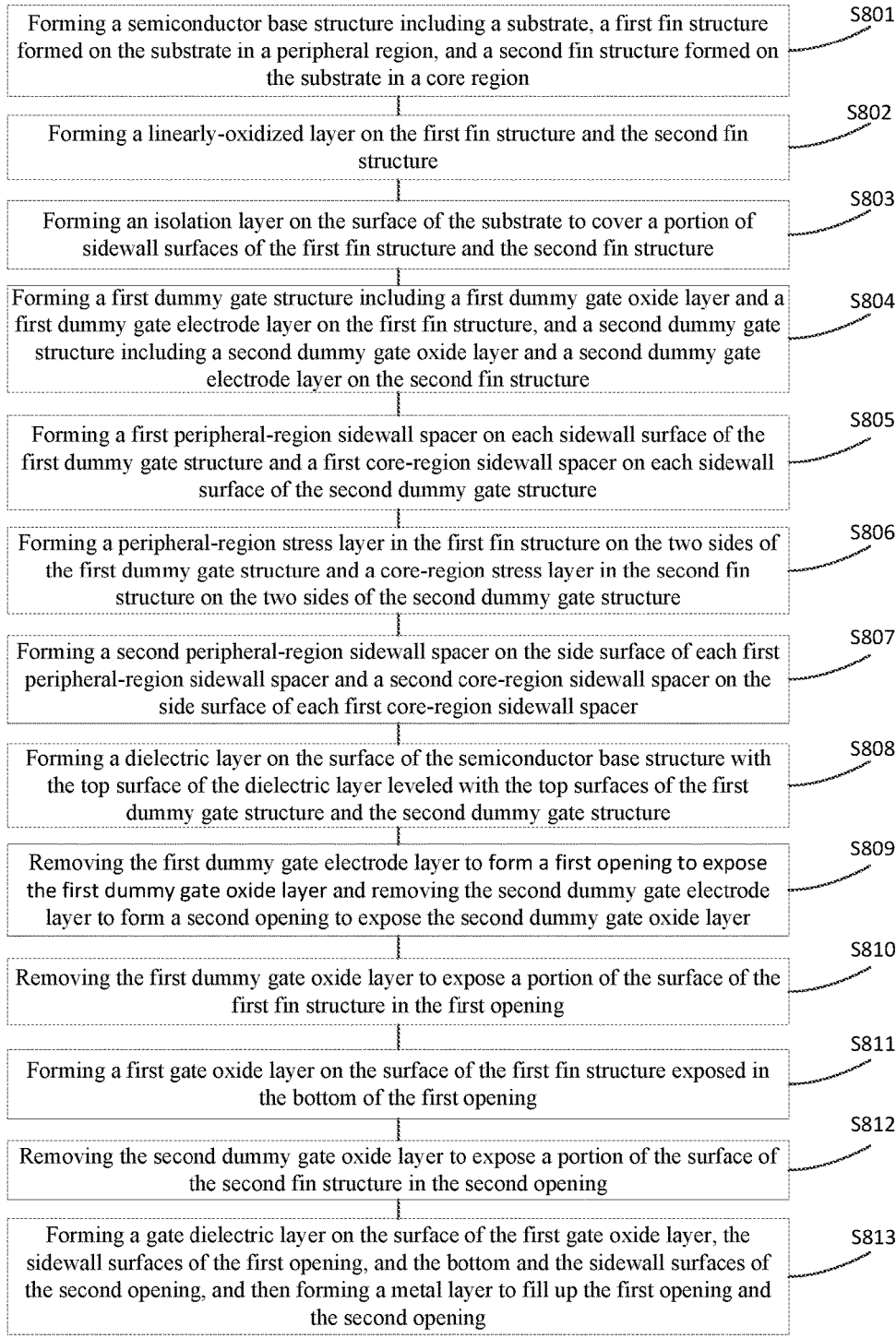
FIG. 20 illustrates a flowchart of an exemplary fabrication process for a semiconductor structure consistent with disclosed embodiments in the present disclosure.

The present disclosure provides a semiconductor structure and a method for fabricating a semiconductor structure. FIG. 20 shows a flowchart of an exemplary fabrication process consistent with the disclosed embodiments. FIGS. 6-19 show schematic views of semiconductor structure at certain stages of the fabrication process consistent with the disclosed embodiments.

Figure 6:
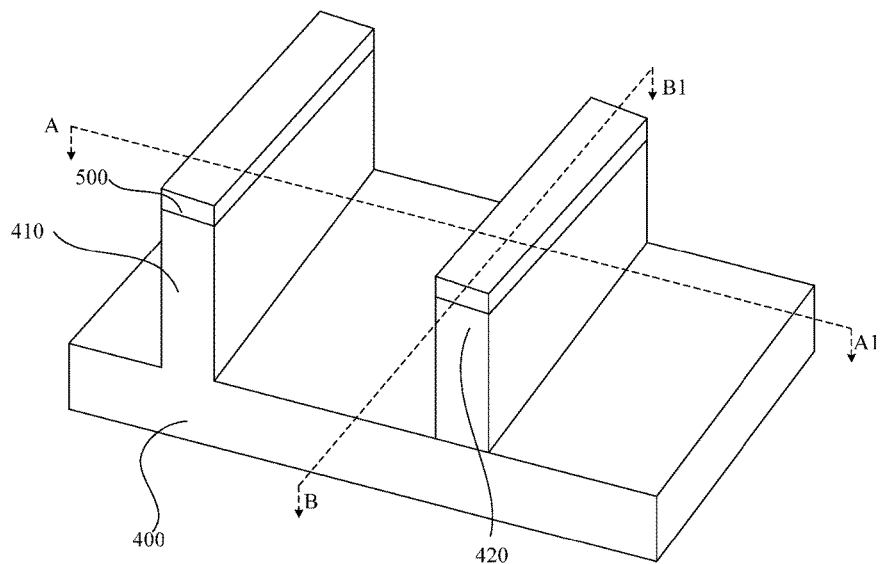
FIGS. 6-19 illustrate schematic cross-section views of semiconductor structures at certain stages of an exemplary fabrication process consistent with disclosed embodiments in the present disclosure.
Figure 7:
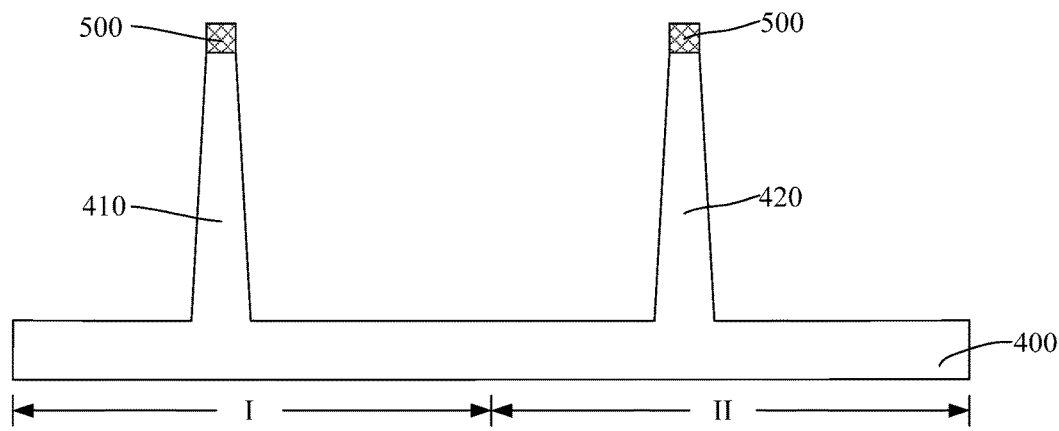

Referring FIG. 20, at the beginning of the fabrication process, a semiconductor base structure is formed (S801). FIG. 6 shows a perspective view of the semiconductor base structure. FIG. 7 shows a schematic cross-section view of the semiconductor base structure shown in FIG. 6 along an AA1 line.

Referring to FIGS. 6-7, a semiconductor base structure may be formed. The semiconductor base structure may include a substrate 400 and a plurality of fin structures protruding from the substrate 400. The substrate 400 may further include a peripheral region I (referring to FIG. 7) and a core region II (referring to FIG. 7). A plurality of fin structures may be formed on the substrate in both the peripheral region I and the core region II. For illustration purposes, the semiconductor base structure is described to have a first fin structure 410 formed on the substrate 400 in the peripheral region I and a second fin structure 420 formed on the substrate 400 in the core region II, although any number of fin structures may be formed in each of the peripheral region I and the core region II.

In one embodiment, a Fin-FET subsequently-formed in the peripheral region I may be used for signal I/O, and the operation power voltage of the Fin-FET subsequently-formed in the peripheral region I may be larger than the operation power voltage of a Fin-FET subsequently-formed in the core region II.

The substrate 400 may be made of one of silicon, germanium, SiGe, SiC, GaAs, InAs, etc. The substrate 400 may also be a silicon on insulator (SOI) or germanium on insulator (GOI) substrate. The first fin structure 410 and the second fin structure 420 may be made of one of silicon, germanium, SiGe, SiC, GaAs, InAs, etc. In one embodiment, the substrate 400 is a silicon substrate, and the first fin structure 410 and the second fin structure 420 are also made of silicon. Moreover, the peripheral region I and the core region II may both be N-type regions or may both be P-type regions.

In one embodiment, the semiconductor base structure may be formed by a process including the following steps. First, an initial substrate is provided. A patterned layer (not shown) may be formed on the surface of the initial substrate. A hard mask layer 500 may be formed on the surfaces of the patterned layer and the initial substrate. Further, an etching process may be performed on the hard mask layer 500, which is formed on the top of the patterned layer and the initial substrate. After the etching process, only the portion of the hard mask layer 500 formed on the sidewall surfaces of the patterned layer may remain. The patterned layer may then be removed to expose a portion of the initial substrate. The shape, the dimension, and the position of the remaining patterned hard mask layer 500 may define the shape, the dimension, and the position of the fin structures to be formed. Finally, a plurality of discrete bulges may be formed by etching the initial substrate along the exposed surface of the initial substrate using the remaining patterned hard mask layer 500 as an etch mask. The bulges formed by the etching process may become the fin structures of the semiconductor base structure, and the etched initial substrate may become the substrate 400. The substrate 400 further includes a peripheral region I and a core region II. The fin structure formed in the peripheral region I may be the first fin structure 410 and the fin structure formed in the core region II may be the second fin structure 420, as shown in FIG. 7.

In one embodiment, the top dimension of the first fin structure 410 may be smaller than the bottom dimension of the first fin structure 410, and the top dimension of the second fin structure 420 may be smaller than the bottom dimension of the second fin structure 420. In other embodiments, the sidewalls of the first fin structure may be perpendicular to the surface of the substrate. That is, the top dimension of the first fin structure may be equal to the bottom dimension of the first fin structure. Similarly, the sidewalls of the second fin structure may be perpendicular to the surface of the substrate. That is, the top dimension of the second fin structure may be equal to the bottom dimension of the second fin structure.

After forming the first fin structure 410 and the second fin structure 420, the portion of the hard mask layer 500 situated on the top of the first fin structure 410 and the second fin structure 420 may be kept. The hard mask layer 500 may be made of $SiN_x$. During a subsequently performed planarization process, the hard mask layer 500 may serve as a stop layer for the planarization process. In addition, the hard mask layer 500 may also provide protection for the top of the first fin structure 410 and the second fin structure 420 during subsequent fabrication processes.

In other embodiment, the semiconductor base structure may also be formed by a process including the following steps. First, an initial substrate is provided. A patterned hard mask layer may be formed on the surface of the initial substrate. The position, the shape, and the dimension of the patterned hard mask layer may define the position, the shape, and the dimension of the subsequently-formed fin structures. Then, a plurality of bulges may be formed by etching the initial substrate using the patterned mask layer as an etch mask. The bulges formed by the etching process may be the fin structures and the etched initial substrate may become the substrate. The substrate further includes a peripheral region and a core region. The fin structure formed in the peripheral region may be the first fin structure and the fin structure formed in the core region may be the second fin structure.

Figure 8:
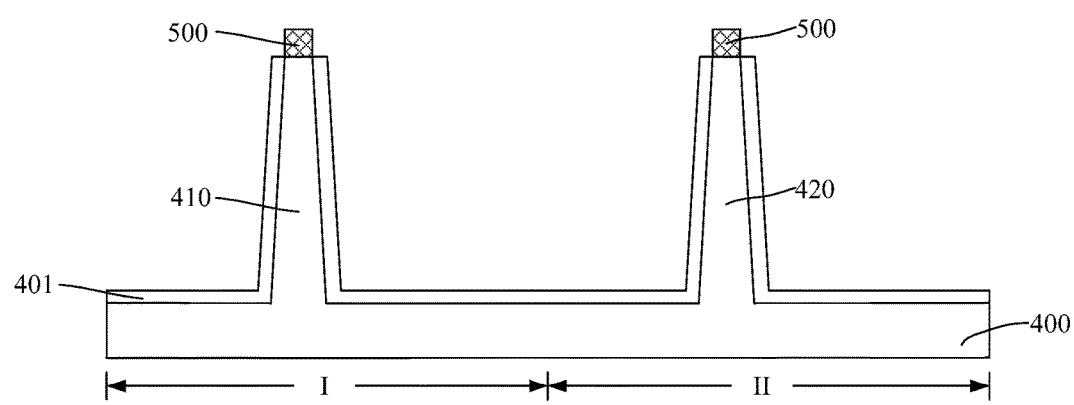

Further, returning to FIG. 20, a linearly-oxidized layer may be formed on the surface of the first fin structure and the second fin structure (S802). FIG. 8 shows a schematic cross-section view of a corresponding semiconductor structure.

Referring to FIG. 8, a linearly-oxidized layer 401 may be formed on each of the first fin structure 410 and the second fin structure 420. The linearly-oxidized layer 401 may be used to recondition the first fin structure 410 and the second fin structure 420.

Because the first fin structure 410 and the second fin structure 420 are formed by etching the initial substrate, the first fin structure 410 and the second fin structure 420 may often have protruding edges and corners. In addition, defects may also exist at the surfaces of the first fin structure 410 and the second fin structure 420. Therefore, the performance of subsequently-formed Fin-FETs may be affected.

In one embodiment, an oxidation treatment process may be performed on the first fin structure 410 and the second fin structure 420 to form a linearly-oxidized layer 401 on each of the first fin structure 410 and the second fin structure 420. Because the protruding edges and corners of the first fin structure 410 and the second fin structure 420 may have a larger specific surface area than structures with flat surfaces, the protruding edges and corners may be easily oxidized during the oxidation treatment process. Therefore, after removing the linearly-oxidized layer 401 in a subsequent process, not only the defect layer at the surface of the first fin structure 410 and the second fin structure 420 may be removed, but the protruding edges and corners may be removed. As such, the surfaces of the first fin structure 410 and the second fin structure 420 may become smooth and the lattice quality may also be improved. Thus, point discharge at the top tips of the first fin structure 410 and the second fin structure 420 may be avoided, which may further help improve the performance of the Fin-FETs.

The oxidation treatment process may be an oxygen plasma oxidation process or a solution oxidation process using a mixture of sulfuric acid and hydrogen peroxide. The oxidation treatment process may also oxidize the surface of the substrate 400. Therefore, a linearly-oxidized layer 401 may also be formed at the surface of the substrate 400. In one embodiment, the oxygen treatment process performed on the first fin structure 410 and the second fin structure 420 in order to form the linearly-oxidized layers 401 may be an in-situ steam generation (ISSG) oxidation process. Accordingly, the linearly-oxidized layers 401 are made of $SiO_2$.

Figure 9:
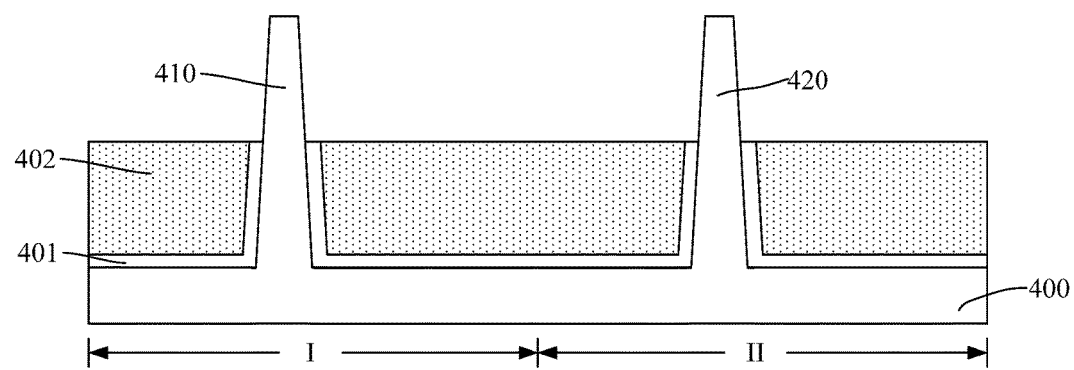

Further, returning to FIG. 20, an isolation layer may be formed on the surface of the substrate (S803). FIG. 9 shows a schematic cross-second view of the semiconductor structure.

Referring to FIG. 9, an isolation layer 402 may be formed on the surface of the substrate 400. The isolation layer 402 may be used as an isolation structure in semiconductor structure. Specifically, the isolation layer 402 may be used to electrically isolate adjacent devices. The isolation layer 402 may be made of $SiO_x$, $SiN_x$, SiON, or any appropriate material. In one embodiment, the isolation layer 402 is made of $SiO_x$.

In one embodiment, the isolation layer 402 is a shallow trench isolation (STI) layer. In other embodiments, the isolation layer may not be limited to STI layer and may have other appropriate forms that may provide sufficient electrical isolation between neighboring devices.

The isolation layer 402 may be formed by a process including the following steps. First, an isolation film may be formed on the surfaces of the linearly-oxidized layers 401. The isolation film may also cover the surface of the hard mask layer 500; that is, the top of the isolation film may be higher than the top of the hard mask layer 500. A planarization process may be performed on the isolation film until the surface of the hard mask layer 500 is exposed. Further, the isolation layer 402 may be formed by removing a top portion of the isolation film through an etch-back process. Finally, a portion of each linearly-oxidized layer 401 formed above the top surface of the isolation layer 402 (referring to FIG. 8) may be removed, and then the hard mask layer 500 may also be removed.

The material used to form the isolation film may be different from the materials used for the first fin structure 410, the second fin structure 420, and substrate 400. Moreover, the isolation layer may be made of a material that can be easily removed. As such, during the subsequent process to remove the portion of the isolation film, damages to the first fin structure 410 and the second fin structure 420 may be avoided.

The isolation film may be made of one of amorphous silicon, $SiO_x$, SiON, SiC, SiOC, SiCON, etc. The isolation film may be formed by chemical vapor deposition (CVD), physical vapor deposition (PVD), or atomic layer deposition (ALD). In one embodiment, the isolation film is made of $SiO_x$ and formed by a CVD process.

In one embodiment, a chemical mechanical planarization process may be performed to planarize the isolation film until the surface of the mask layer 500 is exposed. Then, the isolation layer 402 may be formed by performing a dry etching process, a wet etching process, or a process combining dry etching and wet etching to remove a portion of the isolation film.

The ratio between the thickness of the isolation layer 402 and the height of the first fin structure 410 or the second fin structure 420 may be greater than or equal to ¼ but less than or equal to ½. In one embodiment, the ratio between the thickness of the isolation layer 402 and the height of the first fin structure 410 or the second fin structure 420 is ½.

Figure 10:
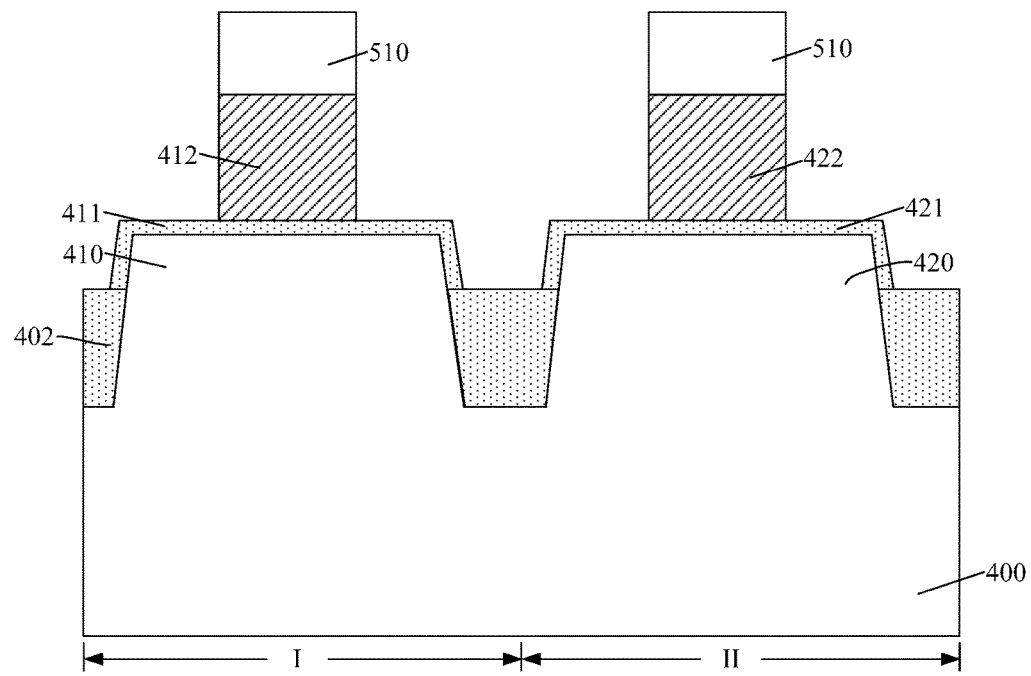

Further, returning to FIG. 20, a first dummy gate structure may be formed on the first fin structure and a second dummy gate structure may be formed on the second fin structure (S804). FIG. 10 shows a schematic cross-section view of a corresponding semiconductor structure. Specifically, the schematic view shown in FIG. 10 corresponds to the cross-section of the semiconductor structure along a BB1 line (referring to FIG. 6).

Referring to FIG. 10, a first dummy gate structure (not shown) may be formed on the surface of the first fin structure 410 and a second dummy gate structure (not shown) may be formed on the surface of the second fin structure 420. The first dummy gate structure and the second dummy gate structure may be used to occupy spaces for a subsequently-formed first gate structure and a subsequently-formed second gate structure, respectively.

In one embodiment, the first dummy gate structure includes a first dummy gate oxide layer 411 and a first dummy gate electrode layer 412; the second dummy gate structure includes a second dummy gate oxide layer 421 and a second dummy gate electrode layer 422.

The first dummy gate oxide layer 411 and the second dummy gate oxide layer 421 may be made of $SiO_x$. The first dummy gate electrode layer 412 and the second dummy gate electrode layer 422 may be made of polycrystalline silicon, $SiO_x$, $SiN_x$, SiON, SiCN, SiCON, or amorphous silicon. In one embodiment, the first dummy gate electrode layer 412 and the second dummy gate electrode layer 422 are both made of polycrystalline silicon.

Specifically, the first dummy gate structure and the second dummy gate structure may be formed by a process including the following steps. First, a dummy gate oxide film may be formed on the surfaces of the first fin structure 410 and the second fin structure 420. The dummy gate oxide film may also cover the surfaces of the substrate 400 and the isolation layer 402. A dummy gate electrode film may then be formed on the surface of the dummy gate oxide film, and a first patterned layer 510 may be formed on the surface of the dummy gate electrode film. The position, the shape, and the dimension of the first patterned layer 510 may define the position, the shape, and the dimension for subsequently-formed dummy gate electrode layers. An etching process may then be performed using the first patterned layer 510 as an etch mask to sequentially etch the dummy gate electrode film and the dummy gate oxide film. After the etching process, a first dummy gate structure may be formed on the surface of the first fin structure 410 in the peripheral region I and a second dummy gate structure may be formed on the surface of the second fin structure 420 in the core region II. Specifically, the first dummy gate structure may include a first dummy gate oxide layer 411 and a first dummy gate electrode layer 412 while the second dummy gate structure may include a second dummy gate oxide layer 421 and a second dummy gate electrode layer 422. Finally, after forming the first dummy gate structure and the second dummy gate structure, the first patterned layer 510 may be removed.

In one embodiment, the first patterned layer 510 is a hard mask layer. The first patterned layer 510 may be made of $SiN_x$.

Figure 11:
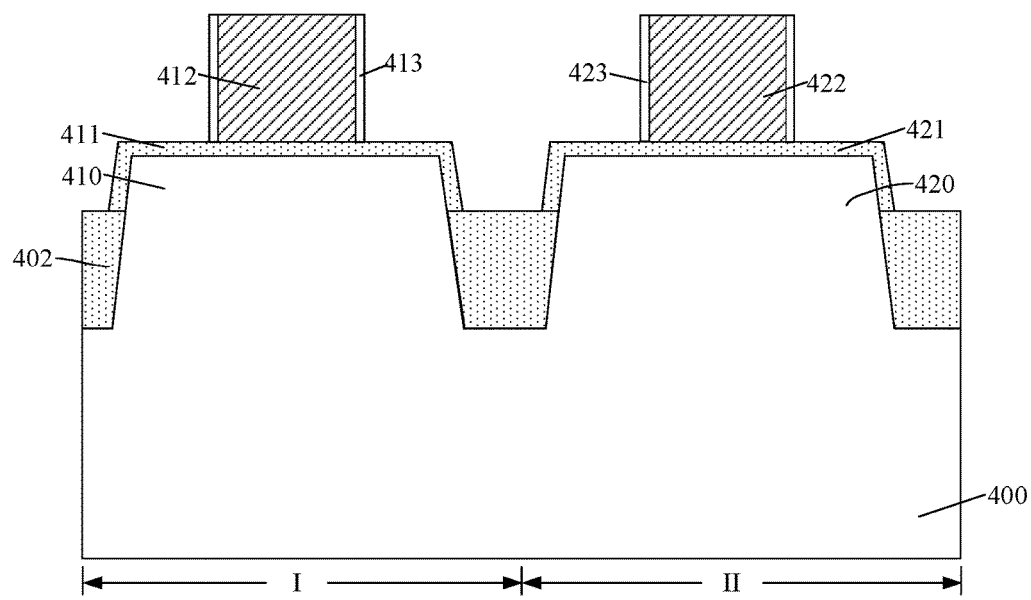

Returning to FIG. 20, further, a first peripheral-region sidewall spacer may be formed on each sidewall of the first dummy gate structure in the peripheral region and a first core-region sidewall spacer may also be formed on each sidewall of the second dummy gate structure in the core region (S805). FIG. 11 shows a schematic cross-section view of the corresponding structure along the BB1 line (referring to FIG. 6).

Referring to FIG. 11, a first peripheral-region sidewall spacer 413 may be formed on each sidewall surface of the first dummy gate structure in the peripheral region I and a first core-region sidewall spacer 423 may be formed on each sidewall surface of the second dummy gate structure in the core region II.

The first peripheral-region sidewall spacer 413 formed in the peripheral region I may be made of $SiO_x$, $SiN_x$, SiC, SiCN, SiCON, SiON, BN, or BCN. The first peripheral-region sidewall spacer 413 formed in the peripheral region I may have a single-layer structure or a multiple-layer structure. The first core-region sidewall spacer 423 formed in the core region II may be made of $SiO_x$, $SiN_x$, SiC, SiCN, SiCON, SiON, BN, or BCN. The first core-region sidewall spacer 423 formed in the core region II may have a single-layer structure or a multiple-layer structure.

In one embodiment, the first peripheral-region sidewall 413 in the peripheral region I may have a single-layer structure and may be made of $SiN_x$; while the first core-region sidewall 423 in the core region II may have a single-layer structure and may be made of $SiN_x$.

Specifically, the first peripheral-region sidewall spacer 413 in the peripheral region I and the first core-region sidewall spacer 423 in the core region II may be formed by a process including the following steps. First, a first sidewall film may be formed on the surfaces of the first dummy gate structure and the second dummy gate structure. The first sidewall film may also cover the surfaces of the substrate 400 and the isolation layer 402. The portion of the first sidewall film formed on the top surfaces of the first dummy gate electrode layer 412 and the second dummy gate electrode layer 422 may be removed by performing a maskless etching process. After the maskless etching process, a first peripheral-region sidewall spacer 413 may be formed on each sidewall surface of the first dummy gate structure in the peripheral region I and a first core-region sidewall spacer 423 may be formed on each sidewall surface of the second dummy gate structure in the core region II.

In one embodiment, the maskless etching process may be a plasma dry etching process. The portion of the first sidewall film formed on the top of the first dummy gate electrode layer 412 and the top of the second dummy gate electrode layer 422 may be removed by etching to form a first peripheral-region sidewall spacer 413 on each sidewall of the first dummy gate structure in the peripheral region I and a first core-region sidewall spacer 423 on each side wall of the second dummy gate structure in the core region II. During the dry etching process, a portion of the first sidewall film formed on the surfaces of the substrate 400 and the isolation layer 402 may be removed.

Figure 12:
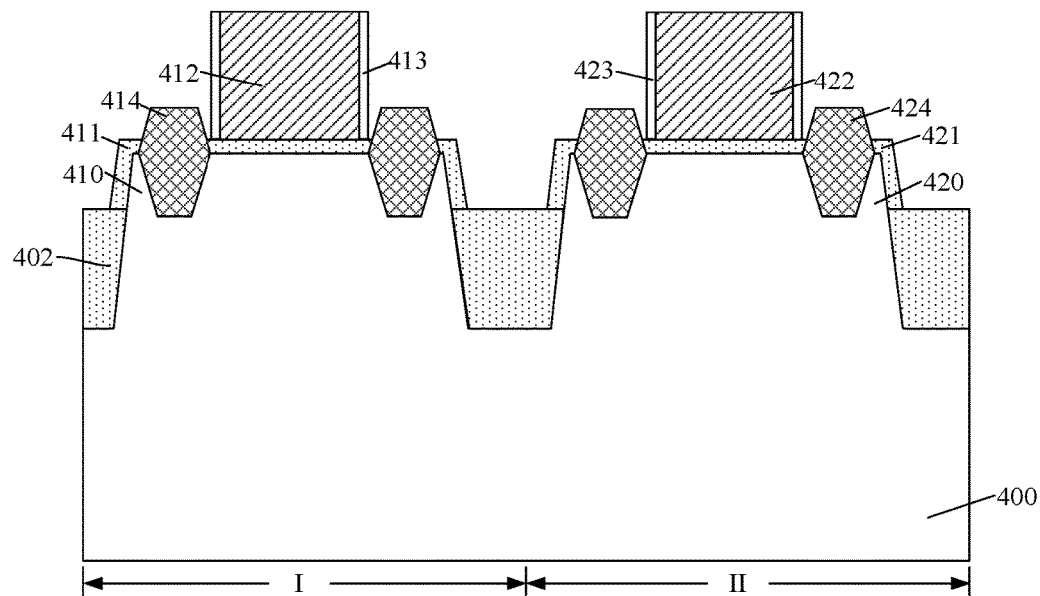

Further, returning to FIG. 20, a peripheral-region stress layer may be formed in the first fin structure on the two sides of the first dummy gate structure, and a core-region stress layer may be formed in second fin structure on the two sides of the second dummy gate structure (S806). FIG. 12 shows a schematic cross-section view of the semiconductor structures.

Referring to FIG. 12, a peripheral-region stress layer 414 may be formed in the first fin structure 410 on the two sides of the first dummy gate structure. In addition, a core-region stress layer 424 may be formed in the second fin structure 420 on the two sides of the second dummy gate structure.

The peripheral-region stress layer 414 and the core-region stress layer 424 may be used to reduce the resistance of the device as well as the contact resistance in the device. In the meantime, the peripheral-region stress layer 414 and the core-region stress layer 424 may also induce appropriate stress into the channel region of devices in the peripheral region I and also into the channel region of devices in the core groin II. Therefore, the mobility of electrons and holes may be improved, and thus the performance of the semiconductor device may also be improved.

Specifically, the peripheral-region stress layer 414 and the core-region stress layer 424 may be formed by a process including the following steps. First, a mask layer (not shown) may be formed on the surface of the semiconductor base structure. The mask layer may also cover the surfaces of the first dummy gate structure, the second dummy gate structure, the isolation layer 402, and the substrate 400. The mask layer may expose a portion of the surface of the first fin structure 410 on each side of the first dummy gate structure and a portion of the surface of the second fin structure 420 on each side of the second dummy gate structure. Further, the exposed portion of the first fin structure 410 and the second fin structure 420 may be etched by a first etching process using the mask layer as an etch mask. An initial opening (not shown) may then be formed in the first fin structure 410 on each side of the first dummy gate structure; in addition, an initial opening (not shown) may also be formed in the second fin structure 420 on each side of the second dummy gate structure. Each initial openings may be further etched by a second etching process using the mask layer as an etch mask to form a trench (not shown). The depth of the trench may be larger than the depth of the initial opening, while the cross-sectional area of the trench may also be larger than the cross-sectional area of the initial opening. After forming the trenches, the mask layer may be removed by a wet etching process or by an ashing process.

Finally, a peripheral-region stress layer 414 may be formed in each trench formed in the first fin structure 410 and a core-region stress layer 424 may be formed in each trench formed in the second fin structure 420.

In one embodiment, the first etching process is a plasma dry etching process. The process parameters used in the first etching process may include an etch gas including one or more of $CF_4$, $CH_3F$, HBr, $NF_3$, $Cl_2$, $O_2$, and $N_2$, a carrier gas including at least one of Ar and He, a chamber pressure in a range of 2 mTorr to 100 mTorr, an offset voltage in a range of 50 V to 250 V, a process temperature in a range of 30° C. to 100° C., and a process time in a range of 3 s to 20 s.

In one embodiment, the second etching process is a wet etching process. The wet etching process may demonstrate a large etch selectivity ratio on silicon. Specifically, during the wet etching process, the etching rate on silicon is anisotropic, and thus trenches may then be formed in the first fin structure 410 on the two sides of the first dummy gate structure and in the second fin structure 420 on the two sides of the second dummy gate structure. The wet etching process may use an etching liquid including tetramethyl ammonium hydroxide solution. During the wet etching process, the process temperature may be in a range of 20° C. to 120° C. and the process time may be in a range of 20 s to 500 s.

The peripheral-region stress layer 414 and the core-region stress layer 424 may be made of one of silicon, germanium, SiGe, SiC, GaAs, InAs, etc. In one embodiment, the peripheral-region stress layer 414 and the core-region stress layer 424 are both made of silicon.

In one embodiment, the peripheral-region stress layer 414 and the core-region stress layer 424 may be formed by an epitaxial CVD growth process. The lattice constant of the material used to form the peripheral-region stress layer 414 may be the same as the lattice constant of the material of the first fin structure 410, while the lattice constant of the material used to form the core-region stress layer 424 may be the same as the lattice constant of the material of the second fin structure 420. Therefore, during the epitaxial CVD growth process, an epitaxial film may be grown layer by layer along the crystal orientation of the exposed surface of the first fin structure 410 in each trench of the peripheral region; in the meantime, an epitaxial film may also be grown layer by layer along the crystal orientation of the exposed surface of the second fin structure 420 in each trench of the core region. The epitaxial CVD growth process may be performed until a peripheral-region stress layer 414 with a thickness meeting a targeted value is formed in the first fin structure 410 while a core-region stress layer 424 with a thickness meeting a targeted value is formed in the second fin structure 420. The top surface of the formed peripheral-region stress layer 414 may be higher than the top surface of the first dummy gate oxide layer 411 while the top surface of the formed core-region stress layer 424 may be higher than the top surface of the second dummy gate oxide layer 421.

The process parameters used in the epitaxial CVD growth process may include a process temperature in a range of 500° C. and 950° C., a process time in a range of 1000 s to 11000 s, a chamber pressure in a range of 5 Torr to 1000 Torr. Further, a pretreatment gas used in the epitaxial CVD growth process for forming the peripheral-region stress layer 414 and the core-region stress layer 424 may be hydrogen, and a reaction gas used in the epitaxial CVD growth process for forming the peripheral-region stress layer 414 and the core-region stress layer 424 may include one or more of HCl, $SiH_2Cl_2$, $SiH_4$, etc.

Figure 13:
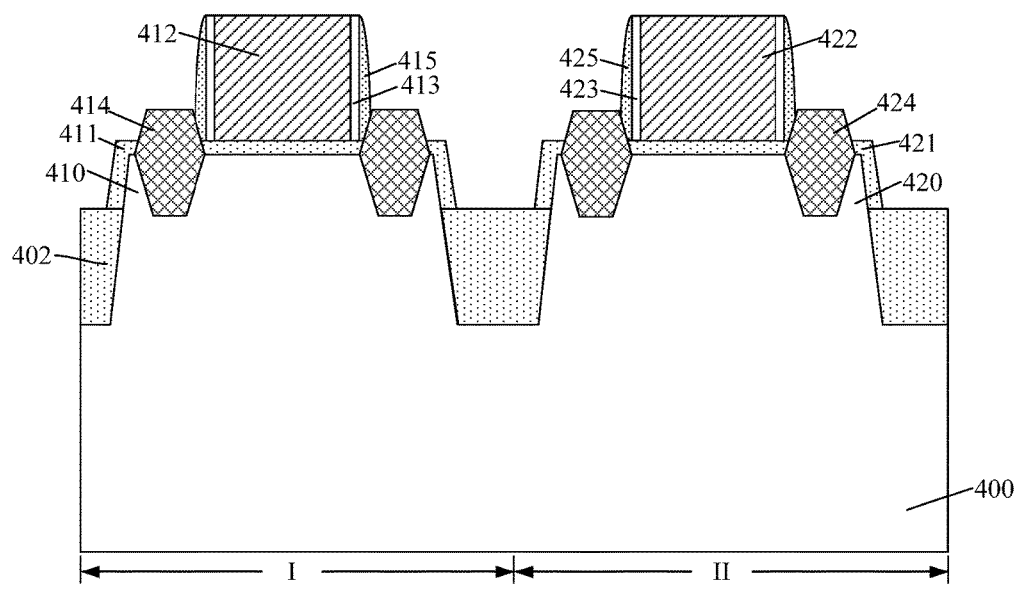

Further, returning to FIG. 20, a second peripheral-region sidewall spacer may be formed on the side surface of each first peripheral-region sidewall spacer in the peripheral region and a second core-region sidewall spacer may be formed on the side surface of each first core-region sidewall spacer in the core region (S807). FIG. 13 shows a schematic cross-section view of a corresponding semiconductor structure.

Referring to FIG. 13, a second peripheral-region sidewall spacer 415 may be formed on the side surface of each first peripheral-region sidewall spacer in the peripheral region I. In the meantime, a second core-region sidewall spacer 425 may be formed on the side surface of each first core-region sidewall spacer in the core region II.

The second peripheral-region sidewall spacer 415 may be made of $SiO_x$, $SiN_x$, SiC, SiCN, SiCON, SiON, BN, or BCN. The second peripheral-region sidewall spacer 415 may have a single-layer structure or a multiple-layer structure. The second core-region sidewall spacer 425 may also be made of $SiO_x$, $SiN_x$, SiC, SiCN, SiCON, SiON, BN, or BCN. The second core-region sidewall spacer 425 may also have a single-layer structure or a multiple-layer structure.

In one embodiment, the second peripheral-region sidewall spacer 415 may have a single-layer structure and may be made of $SiN_x$; while, the second core-region sidewall spacer 425 may also have a single-layer structure and may be made of $SiN_x$.

Specifically, the second peripheral-region sidewall spacer 415 and the core-region sidewall spacer 425 may be made of a process including the following steps. First, a second sidewall film may cover the top surfaces of the first dummy gate electrode layer 412 and the second dummy gate electrode layer 422 as well as the surface of the isolation layer 402. The portion of the second sidewall film formed on the top surfaces of the first dummy gate electrode layer 412 and the second dummy gate electrode layer 422 may be removed by performing a maskless etching process. After the maskless etching process, a second peripheral-region sidewall spacer 415 may be formed on each sidewall surface of the first peripheral-region sidewall spacer 413 in the peripheral region I and a second core-region sidewall spacer 425 may be formed on each sidewall surface of the first core-region sidewall spacer 423 in the core region II.

In one embodiment, the maskless etching process may be a dry etching process. The portion of the second sidewall film formed on the top of first dummy gate electrode layer 412 and the top of the second dummy gate electrode layer 422 may be removed by etching to form a second peripheral-region sidewall spacer 415 on each sidewall of the first peripheral-region sidewall spacer 413 in the peripheral region I and a second core-region sidewall spacer 425 on each side wall of the first core-region sidewall spacer 423 in the core region II. During the dry etching process, a portion of the second sidewall film formed on the surface of the isolation layer 402 may be removed.

Further, after forming the second peripheral-region sidewall spacer 415 and the second core-region sidewall spacer 425, a peripheral-region source/drain region (not shown) may be formed in the first fin structure 410 and the peripheral-region stress layer 414 on each side of the first dummy gate structure. A core-region source/drain region (not shown) may also be formed in the second fin structure 420 and the core-region stress layer 424 on each side of the second dummy gate structure.

Figure 14:
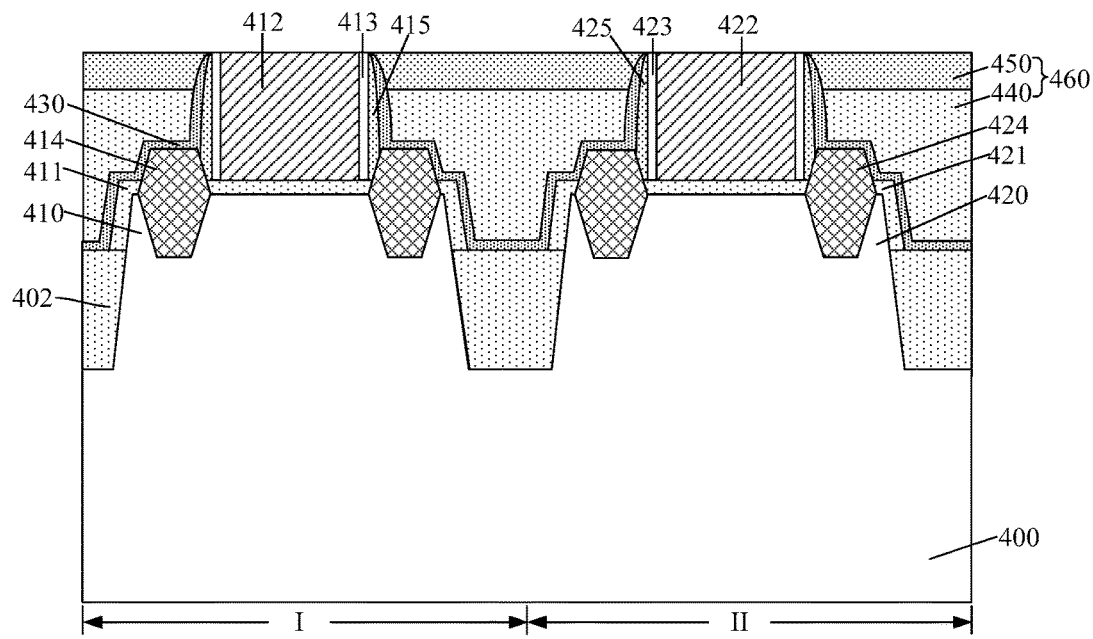

Returning to FIG. 20, further, a dielectric layer may be formed on the surface of the semiconductor base structure (S808). FIG. 14 shows a schematic cross-section view of a corresponding semiconductor structure.

Referring to FIG. 14, a dielectric layer 460 may be formed on the surface of the semiconductor base structure. The top surface of the dielectric layer 460 may be leveled with the top surfaces of the first dummy gate structure and the second dummy gate structure. That is, the top surfaces of the dielectric layer, the first dummy gate electrode layer 412, and the second dummy gate electrode layer 422 may be leveled with each other such that the first dummy gate electrode layer 412 and the second dummy gate electrode layer 422 may be exposed.

In one embodiment, the dielectric layer 460 may be situated on the surface of the isolation layer 402 as well as a portion of the surface of the first fin structure 410 and a portion of the surface of the second fin structure 420. The dielectric layer 470 may also cover the peripheral-region source/drain regions (not shown) and the core-region source/drain regions (not shown) in the II. The top surfaces of the dielectric layer, the first dummy gate electrode layer 412, and the second dummy gate electrode layer 422 may be leveled with each other.

In one embodiment, the dielectric layer 460 may have a multiple-layer structure. Specifically, the dielectric layer 460 may include a first dielectric layer 440 formed on the surface of the semiconductor base structure and a second dielectric layer 450 formed on the surface of the first dielectric layer 440.

The first dielectric layer 440 may be used as an isolation structure to separate the subsequently-formed Fin-FETs. The first dielectric layer 440 may be made of an insulating material such as $SiO_x$, $SiN_x$, SiON, SiOC, SiCN, SiCON, etc. In one embodiment, the first dielectric layer 440 is made of $SiO_x$.

The second dielectric layer 450 may also be made of an insulating material such as $SiO_x$, $SiN_x$, SiON, SiOC, SiCN, SiCON, etc. In one embodiment, the second dielectric layer 450 is made of $SiO_x$. The density of the second dielectric layer 450 may be larger than the density of the first dielectric layer 440. As compared to the first dielectric layer 440, the second dielectric layer 450 may demonstrate better electrical insulation property so that the subsequently-formed isolation structures may also demonstrate desirable electrical insulating property.

In one embodiment, prior to forming the dielectric layer 460, an etch stop layer 430 may be formed on the surface of the semiconductor base structure. The etch stop layer 430 may also cover the surfaces of the first dummy gate structure and the second dummy gate structure.

The etch stop layer 430 may be used to indicate a process stop position for a subsequently-performed etching process in order to form contact vias. In addition, the etch stop layer 430 may also serve as a stop layer in a subsequently-performed planarization process. In one embodiment, the etch stop layer 430 is made of $SiN_x$.

In one embodiment, the dielectric layer may be formed by a process including the following steps. First, after forming the etch stop layer 430 on the surface of the semiconductor base structure, a first dielectric film may be formed over the semiconductor base structure between neighboring fin structures. The first dielectric film may also cover the first dummy gate structure and the second dummy gate structure. The top surface of the first dielectric film may be higher than the top surfaces of the first dummy gate electrode layer 412 and the second dummy gate electrode layer 422. A planarization process may then be performed on the first dielectric film until the top surface of the etch stop layer 430 exposed. An etch-back process may be further performed to remove a portion of the first dielectric film, and thus form the first dielectric layer 440. A second dielectric film may then be formed on the surface of the first dielectric layer 440. The second dielectric film may also cover the surfaces of the first dummy gate structure and the second dummy gate structure. The top surface of the second dielectric film may be higher than the top surfaces of the first dummy gate electrode layer 412 and the second dummy gate electrode layer 422. A planarization process may then be performed on the second dielectric film until the top surfaces of the first dummy gate electrode layer 412 and the second dummy gate electrode layer 422 are exposed. As such, the second dielectric layer 450 may be formed.

Specifically, during the planarization process performed on the second dielectric film, a portion of the etch stop layer 430 formed on the top surfaces of the first dummy gate electrode layer 412 and the second dummy gate electrode layer 422 may be removed. Therefore, the top surfaces of the second dielectric layer 450, the first dummy gate electrode layer 412, and the second dummy gate electrode layer 422 may be leveled with each other.

The openings to be filled by the first dielectric film may include a plurality of openings formed between neighboring fin structures on the substrate 400. In one embodiment, the aspect ratio of the openings to be filled by the first dielectric film may be large. In order to improve the gap-filling ability of the first dielectric film, a flowable chemical vapor deposition (FCVD) process may be adapted to form the first dielectric film. As such, the subsequently-formed first dielectric layer 440 may demonstrate desired adhesion, while the subsequently-formed first dielectric layer 440 may not be porous. In addition, in order to improve the density of the second dielectric film, in one embodiment, a high aspect ratio process (HARP) may be adapted to form the second dielectric film.

In one embodiment, a chemical mechanical polishing (CMP) process may be performed on the first dielectric film to remove the portion of the first dielectric film formed on the top surface of the etch stop layer 430. The etch-back process performed to further remove a portion of the first dielectric film may be a dry etching process, a wet etching process, or a process combining dry etching and wet etching. In addition, the portion of the second dielectric film formed above the top surfaces of the first dummy gate electrode layer 412 and the second dummy gate electrode layer 422 may also be removed by a CMP process.

Figure 15:
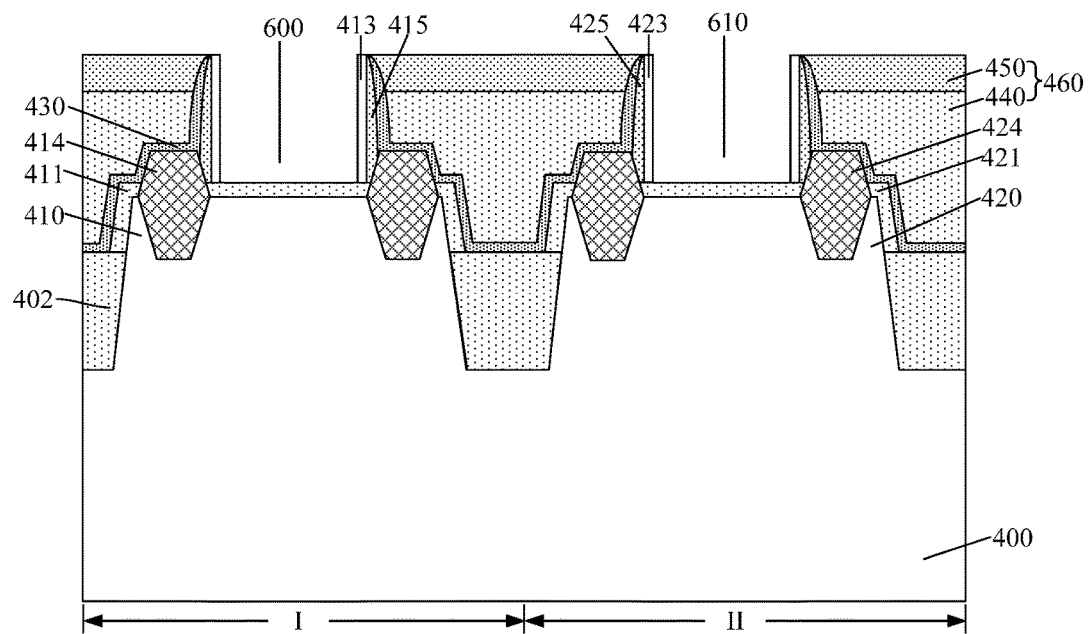

Further, returning to FIG. 20, the first dummy gate electrode layer may be removed to form a first opening in the dielectric layer to expose a portion of the first dummy gate oxide layer, and the second dummy gate electrode layer may also be removed to form a second opening in the dielectric layer to expose a portion of the second dummy gate oxide layer (S809). FIG. 15 shows a schematic cross-section view of a corresponding semiconductor structure.

Referring to FIG. 15, the first dummy gate electrode layer 412 (referring to FIG. 14) may be removed to form a first opening 600 in the dielectric layer 460, while the second dummy gate electrode layer 422 (referring to FIG. 14) may be removed to form a second opening 610 in the dielectric layer 460. The first opening 600 may expose a portion of the surface of the first dummy gate oxide layer 411 and the second opening 610 may expose a portion of the surface of the second dummy gate oxide layer 421.

In one embodiment, the first dummy gate electrode layer 412 and the second dummy gate electrode layer 422 may be removed by a same etching process. Specifically, the first dummy gate electrode layer 412 and the second dummy gate electrode layer 422 may be simultaneously removed by a maskless etching process.

In one embodiment, a dry etching process may be performed to remove the first dummy gate electrode layer 412 and the second dummy gate electrode layer 422. Further, because the etching process may have relatively high etching selectivity ratio on the first dummy gate electrode layer 412 and the second dummy gate electrode layer 422, the dielectric layer 460 may not be consumed during the etching process to remove the first dummy gate electrode layer 412 and the second dummy gate electrode layer 422.

Figure 16:
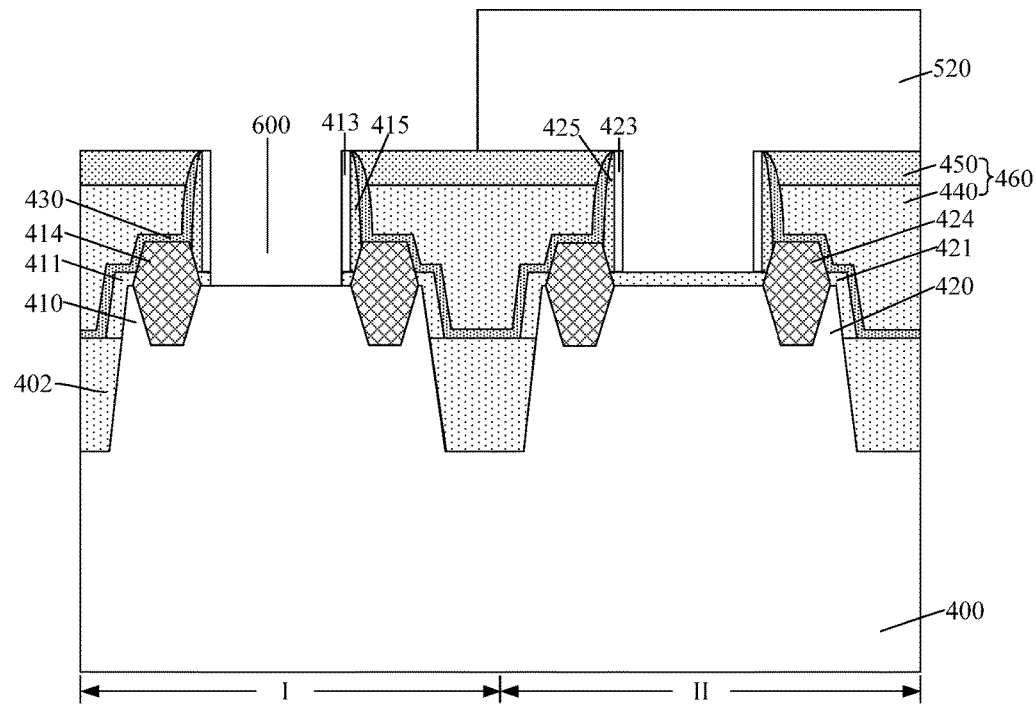

Further, returning to FIG. 20, the portion of the first dummy gate oxide layer exposed in the first opening may be removed to expose a portion of the first fin structure (S810). FIG. 16 shows a schematic cross-section view of a corresponding semiconductor structure.

Referring to FIG. 16, the portion of the first dummy gate oxide layer 411 (referring to FIG. 15) exposed in the first opening 600 may be removed to expose a portion of the surface of the first fin structure 410.

Specifically, the first dummy gate oxide layer exposed in the first opening may be removed by a process including the following steps. First, a second patterned layer 520 may be formed to cover the core region II. The second patterned layer 520 may expose the surface of the first dummy gate oxide layer 411. The first dummy gate oxide layer 411 may then be removed by a dry etching process until the surface of the first fin structure 410 is exposed in the first opening 600. Finally, the second patterned layer 520 may be removed.

In one embodiment, the second patterned layer 520 may be made of a photoresist material with desired filling ability. The process to form the second patterned layer 520 may include the following steps. A second photoresist film may be formed to cover the semiconductor base structure. The second photoresist film may also fill up the second opening 610 (referring to FIG. 15) and cover the surface of the dielectric layer 460. An exposure development process may then be performed to remove the portion of the second photoresist film formed in the peripheral region, and thus form the second patterned layer 520. The second patterned layer 520 may expose the surface of the first dummy gate oxide layer 411 (referring to FIG. 15) on the bottom of the first opening 600. Further, after removing the first dummy oxide layer 411, a wet photoresist stripping process or an ashing process may be performed to remove the second patterned layer 520.

In one embodiment, the process to form the first dummy gate structure and the etching process to remove the first dummy gate structure may cause damages to the first dummy gate oxide layer 411. When the first dummy gate oxide layer 411 is used as a component of the subsequently-formed first gate structure in the peripheral region I, the damaged first dummy gate oxide layer 411 may have negative influence on the quality of the formed first gate structure in the peripheral region I. Further, the damaged regions of the first dummy gate oxide layer 411 may be closed to the channel edge of the device in the peripheral region I, the electrical performance of the semiconductor device may be degraded. Therefore, in order to avoid negative influence of the damaged first dummy gate oxide layer 411 on the electrical performance of the formed semiconductor device, the first dummy gate oxide layer 411 may be removed prior to the formation of the first gate structure in the peripheral region I.

Figure 17:
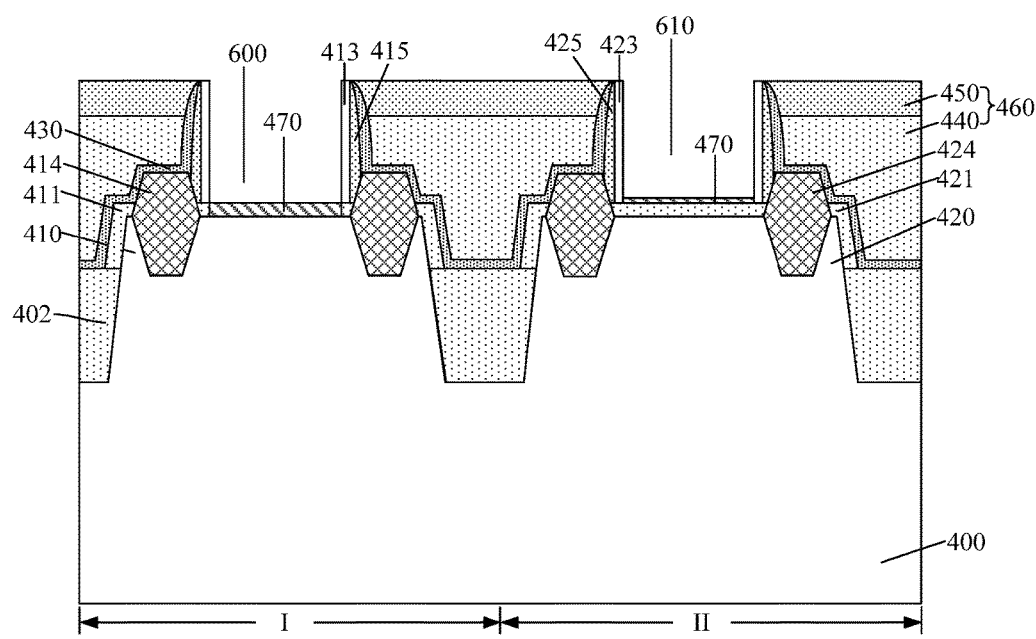

Further, returning to FIG. 20, a first gate oxide layer may be formed on the surface of the first fin structure exposed in the bottom of the first opening (S811). FIG. 17 shows a schematic cross-section view of a corresponding semiconductor structure.

Referring to FIG. 17, a first gate oxide layer 470 may be formed on the surface of the first fin structure 410 situated on the bottom of the first opening 600.

In one embodiment, the first gate oxide layer 470 may be used as a component of the subsequently-formed first gate structure in the peripheral region I. The first gate oxide layer 470 may be made of $SiO_x$.

Specifically, the first gate oxide layer 470 may be formed by an ISSG oxidation process. The process parameters used in the ISSG oxidation process may include a process gas including $O_2$ and $H_2$, a flow rate of $O_2$ in a range of 1 sccm to 30 sccm, a flow rate of $H_2$ in a range of 1.5 sccm to 15 sccm, and a chamber temperature in a range of 700° C. to 1200° C.

In one embodiment, while forming the first oxide layer 470 on the surface of the first fin structure 410 in the first opening 600, the first gate oxide layer 470 may also be simultaneously formed on the surface of the second dummy gate oxide layer 421 on the bottom of the second opening 610. The thickness of the first gate oxide layer 470 formed on the surface of the second dummy gate oxide layer 421 on the bottom of the second opening 610 may be smaller than the thickness of the first gate oxide layer 470 formed on the top of first fin structure 411. Further, in a subsequent process, the portion of the first gate oxide layer 470 formed on the surface of the second dummy gate oxide layer 421 on the bottom of the second opening 610 may be removed.

Figure 18:
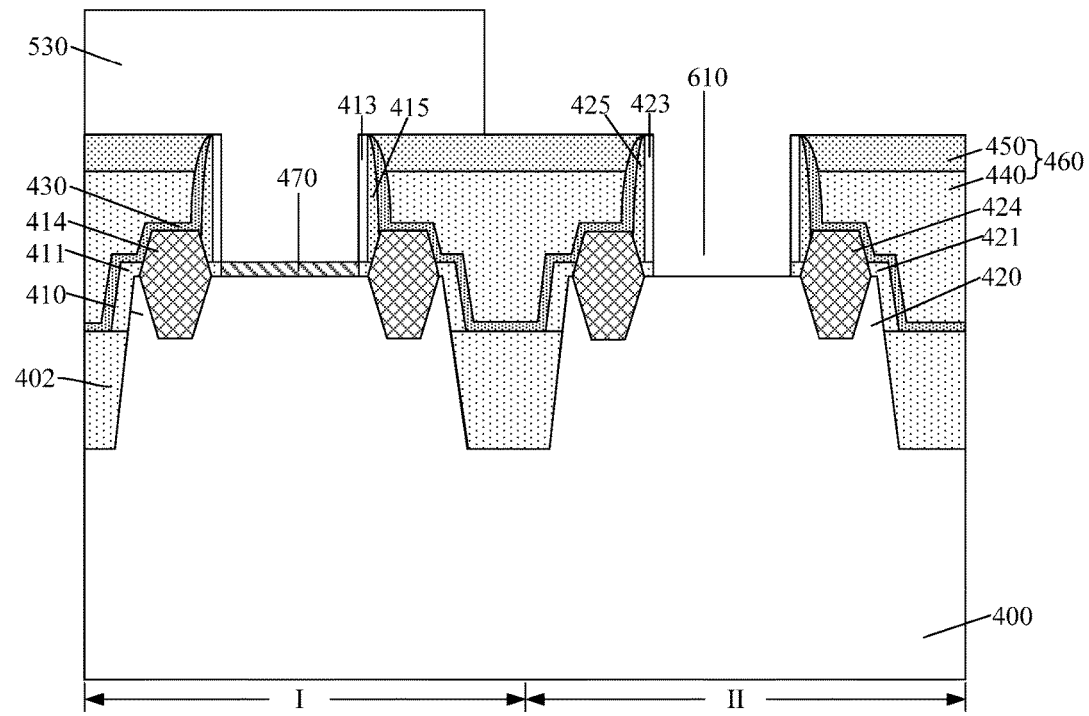

Further, returning to FIG. 20, the second dummy gate oxide layer on the bottom of the second opening may be removed to expose a portion of the surface of the second fin structure (S812). FIG. 18 shows a schematic cross-section view of a corresponding semiconductor structure.

Referring to FIG. 18, after forming the first gate oxide layer 470, the second dummy gate oxide layer 421 on the bottom of the second opening 610 may be removed to expose a portion of the surface of the second fin structure 420.

In one embodiment, the operation power voltage of the devices in the core region II may be smaller than the operation power voltage of the devices in the peripheral region I. In order to prevent electrical breakdown, a larger thickness is required for the dielectric layer when the operation power voltage becomes larger. Thus, the thickness of the dielectric layer in the core region II may be smaller than the thickness of the dielectric layer in the peripheral region I. Therefore, in one embodiment, before forming the dielectric layer in the core region II, the second dummy gate oxide layer 421 on the bottom of the second opening 610 may be removed.

Specifically, the second dummy gate oxide layer 421 on the bottom of the second opening 610 may be removed by a process including the following steps. First, a third patterned layer 530 may be formed to cover the peripheral region I. The third patterned layer 530 may expose the surface of the second dummy gate oxide layer 421 (referring to FIG. 17). A dry etching process may then be performed to remove the second dummy gate oxide layer 421 (referring to FIG. 17) until a portion of the surface of the second fin structure 420 is exposed and the second opening 610. Finally, the third patterned layer 530 may be removed.

In one embodiment, the portion of the first gate oxide layer 470 formed on the surface of the second dummy gate oxide layer 421 may also be removed during the etching process to remove the second dummy gate oxide layer 421.

Further, returning to FIG. 20, a gate dielectric layer may be formed on the surface of the first gate oxide layer, the sidewall surfaces of the first opening, and the bottom and the sidewall surfaces of the second opening, and then a metal layer may be filled into the first opening and the second opening (S813). FIG. 19 shows a schematic cross-section view of a corresponding semiconductor structure.

Referring to FIG. 19, a gate dielectric layer (not shown) may be formed on the surface of the first gate oxide layer 470, the sidewall surfaces of the first opening 600 (referring to FIG. 16), and the bottom and the sidewall surfaces of the second opening 610 (referring to FIG. 17). Then, a metal layer (not shown) may be filled into the first opening 600 and the second opening 610. The first gate oxide layer 470 together with the portion of the gate dielectric layer and the metal layer formed in the first opening 600 may form a first gate structure (not shown). The portion of the gate dielectric layer and the metal layer formed in the second opening 610 may form a second gate structure (not shown).

In one embodiment, after forming the gate dielectric layer on the surface of the first gate oxide layer 470, the sidewall surfaces of the first opening 600, and the bottom and the sidewall surfaces of the second opening 610, a work function layer (not shown) may be formed on the surface of the gate dielectric layer before further forming the metal layer to fill the first opening 600 and the second opening 610.

In one embodiment, when the peripheral region I and the core region II are both N-type regions, the work function layer may be made of an N-type work function material; when the peripheral region I and the core region II are both P-type regions, the work function layer may be made of a P-type work function material.

Specifically, when the peripheral region I and the core region II are both N-type regions, the N-type work function material used to form the work function layer may have a work function in a range of 3.9 eV to 4.5 eV. For example, the work function of the N-type work function material may be 4.0 eV, 4.1 eV, or 4.3 eV. The work function layer may have a single layer structure or a multiple-layer structure. The N-type work function material may include one or more of TiAl, TaAlN, TiAlN, MoN, TaCN, AlN, etc. In one embodiment, the work function material used to form the work function layer is TiAl.

When the peripheral region I and the core region II are both P-type regions, the P-type work function material used to form the work function layer may have a work function in a range of 5.1 eV to 5.5 eV. For example, the work function of the P-type work function material may be 5.2 eV, 5.3 eV, or 5.4 eV. The work function layer may have a single layer structure or a multiple-layer structure. The P-type work function material may include one or more of Ta, TiN, TaN, TaSiN, TiSiN, etc. In one embodiment, the work function material used to form the work function layer is TiN.

In one embodiment, the gate dielectric layer may be made of a high-k dielectric material. The high-k dielectric material may refer to a dielectric material with a relative dielectric constant greater than the relative dielectric constant of $SiO_2$. The high-k dielectric material may include $HfO_2$, HfSiO, HfSiON, HfTaO, HfSiO, HfZrO, $ZrO_2$, $Al_2O_3$, etc.

In one embodiment, the first gate structure and the second gate structure may be formed by a process including the following steps. First, a gate dielectric layer may be formed on the surface of the first gate oxide layer situated on the bottom of the first opening 600, the sidewall surfaces of the first opening 600, and the bottom and sidewall surfaces of the second opening 610. The gate dielectric layer may also cover the surface of the dielectric layer 460. Further, a work function layer may be formed on the surface of the gate dielectric layer, and then a metal layer may be formed on the surface of the work function layer. The metal layer may fill up the first opening 600 and the second opening 610, and the top surface of the metal layer may be higher than the top surface of the dielectric layer 460. The portion of the metal layer formed above the top surface of the dielectric layer 460 may then be removed by a planarization process to form a first gate electrode layer 419 on the surface of the work function layer in the peripheral region I and a second gate electrode layer 429 on the surface of the work function layer in the core region II.

Moreover, during the planarization process to remove the portion of the metal layer formed above the top surface of the dielectric layer 460, the portion of the gate dielectric layer and the portion of the work function layer formed above the top surface of the dielectric layer 460 may also be removed. As such, in the peripheral region I, a first gate dielectric layer 417 may be formed on the surface of the first gate oxide layer 470 and the sidewall surfaces of the first opening 600 (referring to FIG. 16), and a first work function layer 418 may be formed on the surface of the first gate dielectric layer 417; while in the core region, a second gate dielectric layer 427 may be formed on the bottom and the sidewall surfaces of the second opening 610 (referring to FIG. 17), and a second work function layer 428 may be formed on the surface of the second gate dielectric layer 427.

In one embodiment, the first gate structure may include the first gate oxide layer 470, the first gate dielectric layer 417 formed on the surface of the first gate oxide layer 470 as well as the sidewall surfaces of the first opening 600 (referring to FIG. 16), the first work function layer 418 formed on the surface of the first gate dielectric layer 417, and the first gate electrode layer 419 formed on the surface of the first work function layer 418; the second gate structure may include the second gate dielectric layer 427 formed on the bottom and the sidewall surfaces of the second opening 610 (referring to FIG. 17), the second work function layer 428 formed on the surface of the second gate dielectric layer 427, and the second gate electrode layer 429 formed on the surface of the second work function layer 428.

The first gate oxide layer 470 and the first gate dielectric layer 417 may together sever as the gate dielectric layer for the devices in the peripheral region I, and the first work function layer 418 may be used to adjust the threshold voltage of the devices in the peripheral region I. The second gate dielectric layer 427 may be used as the gate dielectric layer for the devices in the core region II, and the second work function layer 428 may be used to adjust the threshold voltage of the devices in the core region II.

The first gate electrode layer 419 may be made of Al, Cu, Ag, Au, Pt, Ni, Ti, or W. The second gate electrode layer 429 may also be made of Al, Cu, Ag, Au, Pt, Ni, Ti, or W. In one embodiment, the first gate electrode layer 419 and the second gate electrode layer 429 are both made of W.

Moreover, in order to improve the interface properties between the first gate structure and the first fin structure 410 and also between the second gate structure and the second fin structure 420, the fabrication process may also include the following steps prior to forming the first gate dielectric layer 417 and the second gate dielectric layer 427. First, an interface layer may be formed on the surface of the first gate oxide layer 470 situated on the bottom of the first opening 600 (referring to FIG. 16), the sidewall surfaces of the first opening 600, and the bottom and the sidewall surfaces of the second opening 610 (referring to FIG. 17). The interface layer may also cover the surface of the dielectric layer 460. Further, during the subsequently-performed planarization process to remove the portion of the metal layer formed above the top surface of the dielectric layer 460, the portion of the interface layer formed above the top surface of the dielectric layer 460 may also be removed to form a first interface layer 416 in the peripheral region I on the surface of the first gate oxide layer 470 as well as the sidewall surfaces of the first opening 600, and a second interface layer 426 in the core region II on the bottom and the sidewall surfaces of the second opening 610.

In one embodiment, before forming the first gate structure, the damaged first dummy gate oxide layer may be removed and then a first gate oxide layer may be formed on the surface of the first fin structure in the peripheral region. Further, the first gate oxide layer may not experience any etching process, and thus damages to the first gate oxide layer due to etching may be avoided. Therefore the film quality of the first gate oxide layer may be desired. Using such a first gate oxide layer as a part of the dielectric layer of the devices in the peripheral region may improve the quality of the first gate structure in the devices of the peripheral region, and thus the electrical performance of the subsequently-formed semiconductor device may be improved.

The present disclosure also provides a semiconductor structure. FIG. 19 shows a schematic cross-section view of the semiconductor structure.

Referring to FIG. 19, the semiconductor structure may include a semiconductor base structure. The semiconductor base structure may include a substrate 400 and a plurality of fin structures formed on the substrate 400. The substrate may include a peripheral region I and a core region II. The plurality of fin structures may be formed in both the core region and the peripheral region. For illustration purposes, the semiconductor structure is described to have a first fin structure 410 formed in the peripheral region I and a second fin structure 420 formed in the core region II. In other embodiments, the number of the fin structures formed in the peripheral region and the number of the fin structures formed in the core region may be greater than one.

Further, the semiconductor structure may also include an isolation layer 402 formed on the substrate 400 between neighboring fin structures. The isolation layer 402 may cover a portion of the sidewall surfaces of each fin structure and the top surface of the isolation layer 402 may be lower than the top surfaces of the fin structures.

Further, in the peripheral region I, the semiconductor structure may include a first gate structure (not shown) formed on a portion of the surface of the first fin structure 410. The first gate structure may include a first gate oxide layer 470 and a first gate dielectric layer 417 formed on the surface of the first gate oxide layer 470 as well as the sidewall surfaces of a first opening 600 (referring to FIG. 16), which is formed by removing a first dummy gate structure, initially formed on the surface of the first fin structure 410 in the peripheral region I to occupy a space for the first gate structure. Specifically, the first dummy gate structure may include a first dummy gate oxide layer formed on the surface of the first fin structure and a first dummy gate electrode layer formed on the first dummy gate oxide layer. Further, the first gate structure may also include a first work function layer 418 formed on the surface of the first gate dielectric layer 417 and a first gate electrode layer 419 formed on the surface of the first work function layer 418.

In the core region I, the semiconductor structure may include a second gate structure (not shown) formed on a portion of the surface of the second fin structure 420. The second gate structure may include a second gate dielectric layer 427 formed on the bottom and the sidewall surfaces of a second opening 610 (referring to FIG. 18), which is formed by removing a second dummy gate structure initially formed on the surface of the second fin structure 420 in the core region II to occupy a space for the second gate structure. Specifically, the second dummy gate structure may include a second dummy gate oxide layer formed on the surface of the second fin structure and a second dummy gate electrode layer formed on the second dummy gate oxide layer. Further, the second gate structure may also include a second work function layer 428 formed on the surface of the second gate dielectric layer 427 and a second gate electrode layer 429 formed on the surface of the second work function layer 428.

The first gate oxide layer 470 and the first gate dielectric layer 417 may together sever as the gate dielectric layer for the devices in the peripheral region I, and the first work function layer 418 may be used to adjust the threshold voltage of the devices in the peripheral region I. The second gate dielectric layer 427 may be used as the gate dielectric layer for the devices in the core region II, and the second work function layer 428 may be used to adjust the threshold voltage of the devices in the core region II.

The semiconductor structure may also include a peripheral-region source region (not shown) and a peripheral-region drain region (not shown) formed in a peripheral-region stress layer 414 situated in the first fin structure 410 on the two sides of the first gate structure, and a core-region source region (not shown) and a core-region drain region (not shown) formed in a core-region stress layer 424 situated in the second fin structure 420 on the two sides of the second gate structure.

The semiconductor structure may also include a sidewall spacer (not shown) formed on each sidewall surface of the first gate structure and the second gate structure, and an etch stop layer 430 formed on the surface of the isolation layer 402, a portion of the top and sidewall surfaces of each fin structure, and the surfaces of the sidewall spacers.

The semiconductor structure may further include a dielectric layer 460 formed on the etch stop layer 430. The top surfaces of the dielectric layer 460, the first gate electrode layer 419, and the second gate electrode layer 429 may be leveled with each other.

Moreover, in order to improve the interface properties between the first gate structure and the first fin structure 410 and also between the second gate structure and the second fin structure 420, the fabrication process for the semiconductor structure may include the following steps prior to forming the first gate dielectric layer 417 and the second gate dielectric layer 427. First, an interface layer may be formed on the surface of the first gate oxide layer 470 situated on the bottom of the first opening 600 (referring to FIG. 16), the sidewall surfaces of the first opening 600, and the bottom and the sidewall surfaces of the second opening 610 (referring to FIG. 18). The interface layer may also cover the surface of the dielectric layer 460. Further, during the subsequently-performed planarization process to remove the portion of the metal layer formed above the top surface of the dielectric layer 460, the portion of the interface layer formed above the top surface of the dielectric layer 460 may also be removed to form a first interface layer 416 in the peripheral region I on the surface of the first gate oxide layer 470 as well as the sidewall surfaces of the first opening 600, and a second interface layer 426 in the core region II on the bottom and the sidewall surfaces of the second opening 610.

In one embodiment, before forming the first gate structure, the damaged first dummy gate oxide layer may be removed and then a first gate oxide layer may be formed on the surface of the first fin structure in the peripheral region. Further, the first gate oxide layer may not experience any etching process, and thus damages to the first gate oxide layer due to etching may be avoided. Therefore the film quality of the first gate oxide layer may be desired. Using such a first gate oxide layer as a part of the dielectric layer of the devices in the peripheral region may improve the quality of the first gate structure in the devices of the peripheral region, and thus the electrical performance of the subsequently-formed semiconductor device may be improved.

Compared to existing semiconductor structures and fabrication methods, the disclosed semiconductor structures and fabrication methods may demonstrates several advantages.

According to the present disclosure, a first dummy gate structure is formed on the surface of a first fin structure in a peripheral region, while a second dummy gate structure is formed on the surface of a second fin structure in a core region. The first dummy gate structure includes a first dummy gate oxide layer formed on the surface of the first fin structure and a first dummy gate electrode layer formed on the surface of the first dummy gate oxide layer, while the second dummy gate structure includes a second dummy gate oxide layer formed on the surface of the second fin structure and a second dummy gate electrode layer formed on the surface of the second dummy gate oxide layer. Then, the first dummy gate electrode layer and the second dummy gate electrode layer may be removed to expose the first dummy gate oxide layer and the second dummy gate oxide layer. Further, the first dummy gate oxide layer is removed to expose the surface of a portion of the first fin structure. A first gate oxide layer may then be formed on the exposed surface of the first fin structure. After forming the first oxide layer, the second dummy gate oxide layer may then be removed. Finally, by further forming a gate dielectric layer and a gate electrode layer, a first fin structure may be formed on the surface of the first fin structure in the peripheral region while a second fin structure may be formed on the surface of the second fin structure in the core region.

According to the present disclosure, a first dummy gate structure is formed to occupy a space for a subsequently-formed first gate structure, and a second dummy gate structure is formed to occupy a space for a subsequently-formed second gate structure. In a subsequent process, after removing the first dummy gate electrode layer and the first dummy gate oxide layer, a first gate oxide layer may be formed on the surface of the first fin structure. That is, a gate oxide layer may be re-formed on the first fin structure after removing the first dummy gate structure. Because the re-formed first gate oxide layer may not experience any etching process, damages to the first gate oxide layer due to etching may be avoided. Therefore, the film quality of the first gate oxide layer may be desired. Using such a first gate oxide layer as a part of the dielectric layer of the devices in the peripheral region may improve the quality of the first gate structure in the devices of the peripheral region, and thus the electrical performance of the subsequently-formed semiconductor device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    forming a plurality of fin structures on a substrate including a peripheral region and a core region, wherein fin structures formed in the peripheral region are first fin structures, and fin structures formed in the core region are second fin structures;
    forming a first dummy gate structure, including a first dummy gate electrode layer and a first dummy oxide layer, on each first fin structure, and a second dummy gate structure, including a second dummy gate electrode layer and a second dummy oxide layer, on each second fin structure;
    forming a dielectric layer on the substrate having a top surface leveled with top surfaces of the first dummy gate structures and the second dummy gate structures;
    forming a first opening to expose the first dummy oxide layer by removing the first dummy gate electrode layer and a second opening to expose the second dummy oxide layer by removing the second dummy gate electrode layer;
    removing the first dummy gate oxide layer in the first opening in the peripheral region to expose a portion of the first fin structure;
    forming a first gate oxide layer on the exposed first fin structure in the peripheral region;
    after forming the first gate oxide layer, removing the second dummy gate oxide layer in the second opening in the core region to expose a portion of the second fin structure in the core region;
    forming a gate dielectric layer to cover each first gate oxide layer, sidewall surfaces of each first opening, and bottom and sidewall surfaces of each second opening on the second fin structure; and
    forming a metal layer to cover the gate dielectric layer and fill up the first openings and the second openings.

2. The method for fabricating the semiconductor structure according to claim 1, wherein:
    the first gate oxide layer, the gate dielectric layer, and the metal layer formed in each first opening form a first gate structure, and
    the gate dielectric layer and the metal layer formed in each second opening form a second gate structure.

3. The method for fabricating the semiconductor structure according to claim 1, wherein the first gate oxide layer is formed by an in-situ steam generation (ISSG) oxidation process, and process parameters used in the ISSG oxidation process include:
    a process gas including $O_2$ and $H_2$;
    a flow rate of $O_2$ in a range of 1 sccm to 30 sccm;
    a flow rate of $H_2$ in a range of 1.5 sccm to 15 sccm; and
    a chamber temperature in a range of 700° C. to 1200° C.

4. The method for fabricating the semiconductor structure according to claim 1, wherein the dielectric layer is made of one of $HfO_2$, $HfSiO$, $HfSiON$, $HfTaO$, $HfTiO$, $HfZrO$, $ZrO_2$, and $Al_2O_3$.

5. The method for fabricating the semiconductor structure according to claim 1, wherein the core region and the peripheral region are both P-type regions, or both N-type regions.

6. The method for fabricating the semiconductor structure according to claim 5, wherein:
   after forming the gate dielectric layer and prior to filling the first openings and the second openings with the metal layer, a work function layer is formed on the gate dielectric layer;
   when the core region and the peripheral region are both N-type regions, the work function layer is made of an N-type work function material; and
   when the core region and the peripheral region are both P-type regions, the work function layer is made of a P-type work function material.

7. The method for fabricating the semiconductor structure according to claim 6, wherein:
   the N-type work function layer is made of one or more of TiAl, TaAlN, TiAlN, MoN, TaCN, and AlN; and
   the P-type work function layer is made of one or more of Ta, TiN, TaN, TaSiN, and TiSiN.

8. The method for fabricating the semiconductor structure according to claim 1, wherein the first dummy gate structure and the second dummy gate structure are formed by a process including:
   forming a dummy gate oxide film to cover the first fin structures and the second fin structures;
   forming a dummy gate electrode film on the dummy gate oxide film;
   forming a first patterned layer on the dummy gate electrode film, wherein positions, shapes, and dimensions of the first patterned layer define positions, shapes, and dimensions for subsequently-formed dummy gate electrode layers;
   performing an etching process to etch the dummy gate electrode film and the dummy gate oxide film to form a first dummy gate structure on each first fin structure in the peripheral region and form a second dummy gate structure on each second fin structure in the core region, wherein the first dummy gate structure includes a first dummy gate oxide layer and a first dummy gate electrode layer, and the second dummy gate structure includes a second dummy gate oxide layer and a second dummy gate electrode layer; and
   removing the first patterned layer.

9. The method for fabricating the semiconductor structure according to claim 1, wherein the first dummy gate electrode layer and the second dummy gate electrode layer are removed in a same etching process.

10. The method for fabricating the semiconductor structure according to claim 9, wherein the first dummy gate electrode layer and the second dummy gate electrode layer are removed by a dry etching process.

11. The method for fabricating the semiconductor structure according to claim 1, wherein removing the first dummy oxide layer in the first opening includes:
   forming a second patterned layer to cover the core region, wherein the second patterned layer exposes a top surface of the first dummy gate oxide layer;
   performing a dry etching process to remove the first dummy gate oxide layer using the second patterned layer as an etch mask until a portion of the first fin structure is exposed on a bottom surface of the corresponding first opening; and
   removing the second patterned layer.

12. A method for fabricating the semiconductor structure, comprising:
   forming a plurality of fin structures on a substrate including a peripheral region and a core region, wherein fin structures formed in the peripheral region are first fin structures, and fin structures formed in the core region are second fin structures;
   forming a first dummy gate structure, including a first dummy gate electrode layer and a first dummy oxide layer, on each first fin structure, and a second dummy gate structure, including a second dummy gate electrode layer and a second dummy oxide layer, on each second fin structure;
   forming a dielectric layer on the substrate having a top surface leveled with top surfaces of the first dummy gate structures and the second dummy gate structures;
   forming a first opening to expose the first dummy oxide layer by removing the first dummy gate electrode layer and a second opening to expose the second dummy oxide layer by removing the second dummy gate electrode layer;
   removing the first dummy gate oxide layer in the first opening to expose a portion of the first fin structure;
   forming a first gate oxide layer on the exposed first fin structure in the peripheral region;
   forming a third patterned layer to cover the peripheral region, wherein the third patterned layer exposes a top surface of the second dummy gate oxide layer;
   performing a dry etching process to remove the second dummy gate oxide layer using the third patterned layer as an etch mask until a portion of the second fin structure is exposed on a bottom surface of the corresponding second opening;
   removing the third patterned layer;
   forming a gate dielectric layer to cover each first gate oxide layer, sidewall surfaces of each first opening, and bottom and sidewall surfaces of each second opening on the second fin structure; and
   forming a metal layer to cover the gate dielectric layer and fill up the first openings and the second openings.

13. The method for fabricating a semiconductor structure according to claim 2, wherein the first gate structure and the second gate structure are formed by a process including:
   forming the gate dielectric layer on the first gate oxide layer in each first opening, sidewall surfaces of each first opening, and bottom and sidewall surfaces of each second opening, wherein the gate dielectric layer also covers the top surface of the dielectric layer;
   forming a work function layer on the gate dielectric layer;
   forming a metal layer on the work function layer to fill up the first openings and the second openings, wherein a top surface of the metal layer is higher than the top surface of the dielectric layer;
   removing a portion of the metal layer formed above the dielectric layer to form a first gate electrode layer on the work function layer in each first opening in the peripheral region and a second gate electrode layer on the work function layer in each second opening in the core region; and
   removing a portion of the gate dielectric layer and the work function layer formed above the dielectric layer to form a first gate dielectric layer on each first gate oxide layer as well as sidewall surfaces of the corresponding first opening in the peripheral region, a first work function layer on each first gate dielectric layer, a second gate dielectric layer on bottom and sidewall surfaces of each second opening in the core region, and a second work function layer on each second gate dielectric layer, wherein, the first gate oxide layer, the first gate dielectric layer, the first work function layer, and the first gate electrode layer in each first opening together form the first gate structure; and the second gate dielectric layer, the second work function layer, and the second gate electrode layer together form the second gate structure.

14. The method for fabricating the semiconductor structure according to claim 13, wherein:

after removing the second dummy gate oxide layer and prior to forming the gate dielectric layer, an interface layer is formed on the first gate oxide layer in each first opening, sidewall surfaces of each first opening, and bottom and sidewall surfaces of each second opening, wherein the interface layer also covers the top surface of the dielectric layer; and when removing the portion of the metal layer, the work function layer, and the gate dielectric layer formed above the dielectric layer, a portion of the interface layer formed above the dielectric layer is also removed to form a first interface layer on each first gate oxide layer as well as sidewall surfaces of the corresponding first opening in the peripheral region, and a second interface layer on bottom and sidewall surfaces of each second opening in the core region.

15. The method for fabricating the semiconductor structure according to claim 1, wherein:

the first dummy gate structure is made of one of polycrystalline silicon, $SiO_x$, $SiN_x$, SiON, SiCN, SiCON, and amorphous silicon; and the second dummy gate structure is made of one of polycrystalline silicon, $SiO_x$, $SiN_x$, SiON, SiCN, SiCON, and amorphous silicon.

16. The method for fabricating the semiconductor structure according to claim 1, after forming the first dummy gate structure and the second dummy structure and prior to forming the dielectric layer, further including:

forming a first peripheral-region sidewall spacer on each sidewall surface of the first dummy fin structure and a first core-region sidewall spacer on each sidewall surface of the second dummy fin structure;

forming a peripheral-region stress layer in the first fin structure on each side of the first dummy gate structure and a core-region stress layer in the second fin structure on each side of the second dummy gate structure;

forming a second peripheral-region sidewall spacer on a sidewall surface of each first peripheral-region sidewall spacer and a second core-region sidewall spacer on a sidewall surface of each first core-region sidewall spacer; and forming a peripheral-region source region and a peripheral-region drain region in the first fin structure and the peripheral-region stress layer on each side of the first dummy gate structure and a core-region source region and a core-region drain region in the second fin structure and the core-region stress layer on each side of the second dummy gate structure.

17. The method for fabricating the semiconductor structure according to claim 16, wherein:

the peripheral-region stress layer is made of silicon;

the peripheral-region stress layer is formed by an epitaxial chemical vapor deposition growth process;

the core-region stress layer is made of silicon; and the core-region stress layer is formed by an epitaxial chemical vapor deposition growth process, wherein process parameters used in the epitaxial chemical vapor deposition growth process include:

a process temperature in a range of 500° C. to 950° C.;

a process time in a range of 1000 s to 11000 s;

a chamber pressure in a range of 5 Torr to 1000 Torr;

a pretreatment gas of $H_2$; and a reaction gas including one or more of HCl, $SiH_2Cl_2$, and $SiH_4$.

18. A semiconductor structure, comprising:

a plurality of fin structures formed on a substrate including a peripheral region and a core region, wherein fin structures formed in the peripheral region are first fin structures, and fin structures formed in the core region are second fin structures;

a first gate structure formed on a portion of each first fin structure and a second gate structure formed on a portion of each second fin structure; and a dielectric layer formed on the substrate having a top surface leveled with top surfaces of the first gate structures and the second gate structures, wherein:

the first gate structure in the peripheral region includes a first gate oxide layer formed on the first fin structure, a gate dielectric layer formed on the first gate oxide layer and sidewall surfaces of the corresponding first opening, and a first gate electrode layer formed on the first gate dielectric layer;

the second gate structure in the core region includes a second gate dielectric layer formed on the second fin structure and sidewall surfaces of the corresponding second opening, and a second gate electrode layer formed on the second gate dielectric layer, wherein a bottom surface of the second gate dielectric layer directly contacts the second fin structure;

the first gate oxide layer is formed in a first opening formed by removing a first dummy gate structure, including a first dummy gate electrode layer and a first dummy gate oxide layer, previously formed on the first fin structure;

the second gate structure is formed in a second opening formed by removing a second dummy gate structure, including a second dummy gate electrode layer and a second dummy gate oxide layer, previously formed on the second fin structure; and the second dummy gate oxide layer is removed after forming the first gate oxide layer.

19. The semiconductor structure according to claim 18, wherein:

the first gate structure also includes a first interface layer formed on the first gate oxide layer and sidewall surfaces of the corresponding first opening;

the first gate dielectric layer is formed on the first interface layer;

the second gate structure also includes a second interface layer formed on the exposed portion of the second fin structure in the second opening and also on sidewall surfaces of the corresponding second opening; and the second gate dielectric layer is formed on the second interface layer.

20. The semiconductor structure according to claim 18, wherein:

the first gate structure also includes a first work function layer formed between the first gate dielectric layer and the first gate electrode layer; and the second gate structure also includes a second work function layer formed between the second gate dielectric layer and the second gate electrode layer.

\* \* \* \* \*